US011621275B2

(12) United States Patent
Zhang et al.

(10) Patent No.: US 11,621,275 B2
(45) Date of Patent: Apr. 4, 2023

(54) THREE-DIMENSIONAL MEMORY DEVICE WITH HYDROGEN-RICH SEMICONDUCTOR CHANNELS

(71) Applicant: YANGTZE MEMORY TECHNOLOGIES CO., LTD., Wuhan (CN)

(72) Inventors: Kun Zhang, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 218 days.

(21) Appl. No.: 17/020,457

(22) Filed: Sep. 14, 2020

(65) Prior Publication Data

US 2022/0037352 A1 Feb. 3, 2022

Related U.S. Application Data

(63) Continuation of application No. PCT/CN2020/105686, filed on Jul. 30, 2020.

(51) Int. Cl.
*H01L 27/11521* (2017.01)
*H01L 27/11582* (2017.01)
(Continued)

(52) U.S. Cl.
CPC .... *H01L 27/11582* (2013.01); *H01L 27/1157* (2013.01); *H01L 27/11521* (2013.01);
(Continued)

(58) Field of Classification Search
CPC ......... H01L 27/11582; H01L 27/11524; H01L 27/11526; H01L 27/11556; H01L 27/1157; H01L 27/11573
See application file for complete search history.

(56) References Cited

U.S. PATENT DOCUMENTS 9,728,551 B1 * 8/2017 Lu ...................... H01L 23/5226
10,373,971 B2 8/2019 Park et al.
(Continued)

FOREIGN PATENT DOCUMENTS

CN 109411355 A 3/2019
CN 110062958 A 7/2019
(Continued)

OTHER PUBLICATIONS

International Search Report issued in corresponding International Application No. PCT/CN2020/105686, dated Apr. 26, 2021, 4 pages.

*Primary Examiner* — Sarah K Salerno
(74) *Attorney, Agent, or Firm* — Bayes PLLC

(57) ABSTRACT

Embodiments of 3D memory devices and methods for forming the same are disclosed. In an example, a 3D memory device includes a memory stack including interleaved stack conductive layers and stack dielectric layers, a semiconductor layer, a plurality of channel structures each extending vertically through the memory stack into the semiconductor layer, and an insulating structure extending vertically through the memory stack and including a dielectric layer doped with at least one of hydrogen or an isotope of hydrogen.

20 Claims, 16 Drawing Sheets

(51) Int. Cl.
  *H01L 27/11524*  (2017.01)
  *H01L 27/11526*  (2017.01)
  *H01L 27/11556*  (2017.01)
  *H01L 27/1157*   (2017.01)
  *H01L 27/11573*  (2017.01)
  *H01L 27/11568*  (2017.01)

(52) U.S. Cl.
  CPC .. *H01L 27/11524* (2013.01); *H01L 27/11526* (2013.01); *H01L 27/11556* (2013.01); *H01L 27/11568* (2013.01); *H01L 27/11573* (2013.01)

(56) References Cited

U.S. PATENT DOCUMENTS

| | | |
|---|---|---|
| 10,665,581 B1 | 5/2020 | Zhou et al. |
| 2012/0276696 A1 | 11/2012 | Yang et al. |
| 2016/0118391 A1 | 4/2016 | Zhao et al. |
| 2017/0110470 A1 | 4/2017 | Rabkin et al. |
| 2018/0076293 A1* | 3/2018 | Nishimura ............ H01L 29/408 |
| 2019/0148401 A1* | 5/2019 | Lei ...................... H01L 27/1157 257/314 |
| 2020/0035700 A1* | 1/2020 | Xu .................... H01L 21/02178 |
| 2021/0143166 A1* | 5/2021 | Chen ........................ G11C 8/14 |

FOREIGN PATENT DOCUMENTS

| | | |
|---|---|---|
| CN | 110121778 A | 8/2019 |
| TW | 202010053 A | 3/2020 |
| TW | 202015223 A | 4/2020 |
| WO | 2016058324 A1 | 4/2016 |

\* cited by examiner

THREE-DIMENSIONAL MEMORY DEVICE WITH HYDROGEN-RICH SEMICONDUCTOR CHANNELS

CROSS-REFERENCE TO RELATED APPLICATIONS

This application is continuation of International Application No. PCT/CN2020/105686, filed on Jul. 30, 2020, entitled "THREE-DIMENSIONAL MEMORY DEVICE WITH HYDROGEN-RICH SEMICONDUCTOR CHANNELS," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a memory stack including interleaved stack conductive layers and stack dielectric layers, a semiconductor layer, a plurality of channel structures each extending vertically through the memory stack into the semiconductor layer, and an insulating structure extending vertically through the memory stack and including a dielectric layer doped with at least one of hydrogen or an isotope of hydrogen.

In another example, a 3D memory device includes a memory stack including interleaved stack conductive layers and stack dielectric layers, a semiconductor layer, a plurality of channel structures each extending vertically through the memory stack into the semiconductor layer, and an insulating structure extending vertically through the memory stack and including a dielectric layer. Each of the channel structures includes a memory film and a semiconductor channel doped with at least one of hydrogen or an isotope of hydrogen.

In still another example, a method for forming a 3D memory device is disclosed. A channel structure extending vertically through a memory stack into a semiconductor layer on a substrate is formed. The memory stack includes interleaved stack conductive layers and stack dielectric layers. An insulating structure in an opening extending vertically through the memory stack and including a dielectric layer doped with at least one of hydrogen or an isotope of hydrogen is formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
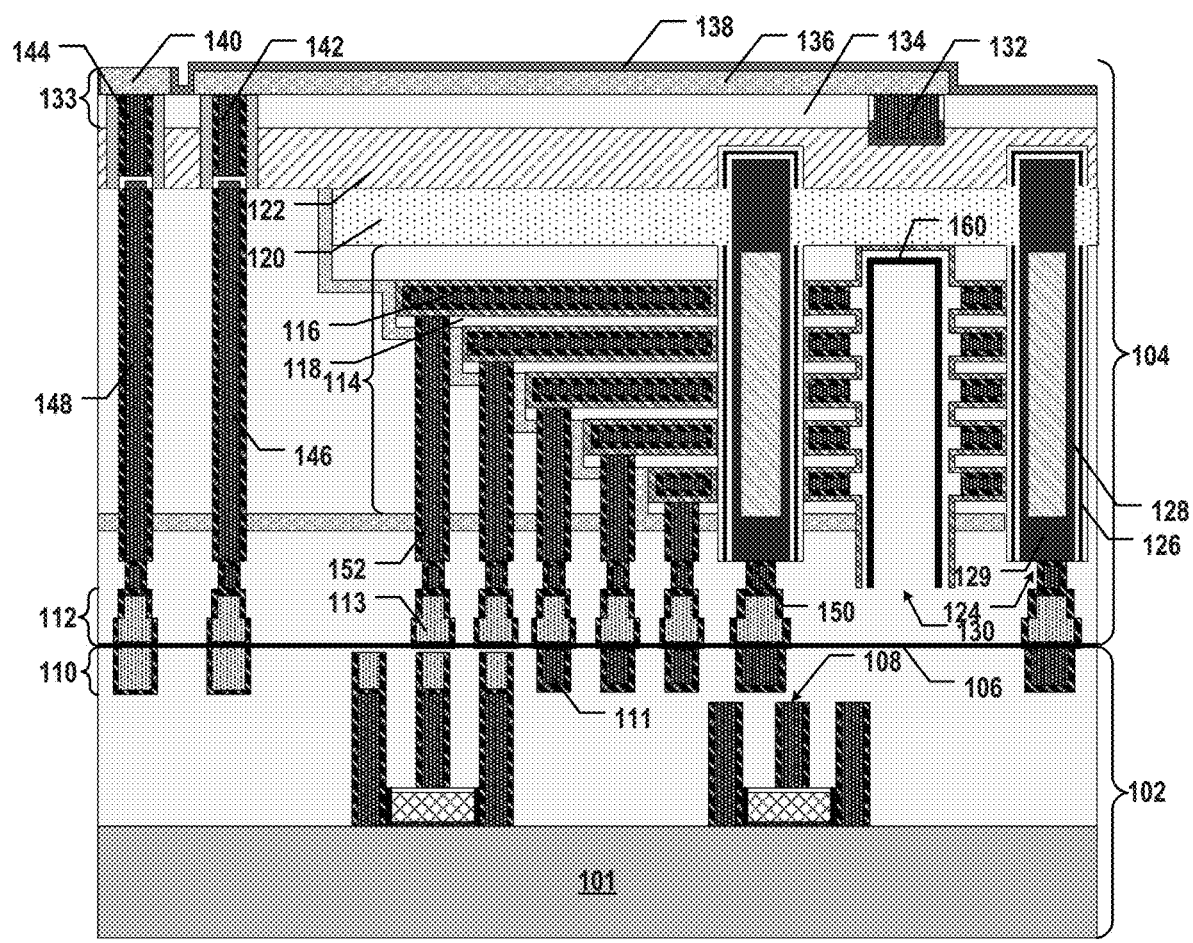
FIG. 1A illustrates a side view of a cross-section of an exemplary 3D memory device with hydrogen-rich semiconductor channels, according to some embodiments of the present disclosure.
Figure 1A:
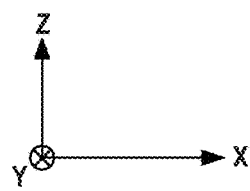

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating some 3D memory devices, more thin films (e.g., silicon oxide, silicon nitride, polysilicon, etc.) need to be deposited on the silicon substrate as the level of memory cells increases. For example, in 3D NAND memory devices, more thin films need to fill in the staircase area, core array area, and gate line slits, which may cause thin film deformation when the thin film structures become more complex, in particular, after thermal processes. The stress due to thin film deformation can further cause the deformation of the entire wafer (e.g., wafer bow), thereby reducing the production yield.

Moreover, 3D NAND memory devices usually use polysilicon as the material of the semiconductor channels. Polysilicon, however, may have defects between grain boundaries and at interfaces (e.g., between semiconductor channel and tunneling layer), which can affect the memory cell performance. For example, dangling bonds can be found at the interfaces, which can attract carriers to reduce the carrier mobility in the semiconductor channels. The dangling bonds may also affect the grain size of polysilicon to increase the internal stress of the polysilicon semiconductor channels.

Various embodiments in accordance with the present disclosure provide 3D memory devices with hydrogen-rich semiconductor channels to improve the cell performance and adjust the wafer stress. Hydrogen and its isotopes, such as protium, deuterium, or tritium, can form stable H—Si covalent bonds to reduce the number of dangling bonds in the polysilicon semiconductor channels, thereby improving the carrier mobility and adjusting the internal stress. In some embodiments, 3D memory devices include hydrogen-rich insulating structures, for example, by depositing dielectric layers (e.g., silicon nitride) doped with at least one of hydrogen or an isotope of hydrogen in the gate line slits. During the later thermal processes, the hydrogen or its isotope can diffuse from the hydrogen-rich insulating structure to the polysilicon semiconductor channels to form hydrogen-rich semiconductor channels, thereby curing the defects of the polysilicon and adjusting the wafer stress. As a result, memory cell performance can be improved, and the production yield can be increased.

FIG. 1A illustrates a side view of a cross-section of an exemplary 3D memory device 100 with hydrogen-rich semiconductor channels, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some embodiments. As shown in FIG. 1A, first semiconductor structure 102 can include a substrate 101, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1A to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1A, second semiconductor structure 104 of 3D memory device 100 can include an array of channel structures 124 functioning as the array of NAND memory strings. As shown in FIG. 1A, each channel structure 124 can extend vertically through a plurality of pairs each including a stack conductive layer 116 and a stack dielectric layer 118. The interleaved stack conductive layers 116 and stack dielectric layers 118 are part of a memory stack 114. The number of the pairs of stack conductive layers 116 and stack dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of stack conductive layers 116 and stack dielectric layers 118 in each memory deck can be the same or different.

Memory stack 114 can include a plurality of interleaved stack conductive layers 116 and stack dielectric layers 118. Stack conductive layers 116 and stack dielectric layers 118 in memory stack 114 can alternate in the vertical direction. In other words, except the ones at the top or bottom of memory stack 114, each stack conductive layer 116 can be adjoined by two stack dielectric layers 118 on both sides, and each stack dielectric layer 118 can be adjoined by two stack conductive layers 116 on both sides. Stack conductive layers 116 can include conductive materials including, but not limited to, W, Co, Cu, Al, polysilicon, doped silicon, silicides, or any combination thereof. Each stack conductive layer 116 can include a gate electrode (gate line) surrounded by an adhesive layer and a gate dielectric layer. The gate electrode of stack conductive layer 116 can extend laterally as a word line, ending at one or more staircase structures of memory stack 114. Stack dielectric layers 118 can include dielectric materials including, but not limited to, silicon oxide, silicon nitride, silicon oxynitride, or any combination thereof.

As shown in FIG. 1A, second semiconductor structure 104 of 3D memory device 100 can also include a first semiconductor layer 120 above memory stack 114 and a second semiconductor layer 122 above and in contact with first semiconductor layer 120. In some embodiments, each of first and second semiconductor layers 120 and 122 is an N-type doped semiconductor layer, e.g., a silicon layer doped with N-type dopant(s), such as phosphorus (P) or arsenic (As). In those cases, first and second semiconductor layers 120 and 122 may be viewed collectively as an N-type doped semiconductor layer 120/122 above memory stack 114. In some embodiments, each of first and second semiconductor layers 120 and 122 includes an N-well. That is, each of first and second semiconductor layers 120 and 122 can be a region in a P-type substrate that is doped with N-type dopant(s), such as P or As. It is understood that the doping concentrations in first and second semiconductor layers 120 and 122 may be the same or different. First semiconductor layer 120 includes polysilicon, for example, N-type doped polysilicon, according to some embodiments. As described below in detail, first semiconductor layer 120 can be formed above a P-type silicon substrate by thin film deposition and/or epitaxial growth. In contrast, second semiconductor layer 122 includes single crystalline silicon, for example, N-type doped single crystalline silicon, according to some embodiments. As described below in detail, second semiconductor layer 122 can be formed by implanting N-type dopant(s) into a P-type silicon substrate having single crystalline silicon.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. For example, semiconductor channel 128 may include polysilicon, In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1A, each channel structure 124 can extend vertically through interleaved stack conductive layers 116 and stack dielectric layers 118 of memory stack 114 and first semiconductor layer 120, e.g., an N-type doped polysilicon layer. In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. As a result, first semiconductor layer 120 surrounding and in contact with semiconductor channel 128 can work as a "sidewall semiconductor plug" of channel structure 124.

In some embodiments, each channel structure 124 can extend vertically further into second semiconductor layer 122, e.g., an N-type doped single crystalline silicon layer. That is, each channel structure 124 extends vertically through memory stack 114 into the N-type doped semiconductor layer (including first and second semiconductor layers 120 and 122), according to some embodiments. As shown in FIG. 1A, the top portion (e.g., the upper end) of channel structures 124 is in second semiconductor layer 122, according to some embodiments. In some embodiments, each of first and second semiconductor layers 120 and 122 is an N-type doped semiconductor layer, e.g., an N-well, to enable GIDL-assisted body biasing for erase operations. The GIDL around the source select gate of the NAND memory string can generate hole current into the NAND memory string to raise the body potential for erase operations.

It is understood that first and second semiconductor layers 120 and 122 illustrate one example of a semiconductor layer that can be used for 3D memory device 100. In a more general case, second semiconductor structure 104 of 3D memory device 100 may include a semiconductor layer having one or more doped silicon layers, such as doped polysilicon layer(s) and/or doped single crystalline silicon layer(s). Moreover, the number of the doped silicon layers in the semiconductor layer and the doping type of each silicon layer in the semiconductor layer are not limited by the example above with respect to FIG. 1A and may vary in other examples. It is also understood that the relative position of channel structure 124 with respect to the semiconductor layer is not limited by the example above with respect to FIG. 1A and may vary in other examples. In a more general case, each channel structure 124 may extend vertically through memory stack 114 into the semiconductor layer regardless of the relative position of the end of channel structure 124 with respect to each doped silicon layer in the semiconductor layer. It is further understood that the erase operation performed by 3D memory device 100 is not limited to GIDL erase in the example above with respect to FIG. 1A and may be P-well bulk erase operation or any other suitable erase operations based on different configurations of the semiconductor layer, for example, the doping type of each doped silicon layer in the semiconductor layer.

Compared with known 3D memory devices with polysilicon semiconductor channels that have defects (e.g., dangling bonds) between grain boundaries and at the interfaces with the tunneling layers, 3D memory device 100 can include hydrogen-rich polysilicon semiconductor channel 128 in each channel structure 124, which have fewer defects (e.g., dangling bonds). In some embodiments, semiconductor channel 128 is doped with at least one of hydrogen or an isotope of hydrogen, such as protium, deuterium, tritium, hydrogen-4, hydrogen-5, etc. The hydrogen or isotope thereof can form a stable H—Si covalent bond with the dangling bonds between the grain boundaries and at the interface with the tunneling layer to reduce the number of dangling bonds, thereby improving the carrier mobility and adjusting the stress of semiconductor channel 128.

As shown in FIG. 1A, second semiconductor structure 104 of 3D memory device 100 can further include insulating structures 130 each extending vertically through interleaved stack conductive layers 116 and stack dielectric layers 118 of memory stack 114. Different from channel structure 124 that extends further through first semiconductor layer 120, insulating structures 130 stops at first semiconductor layer 120, i.e., does not extend vertically into the N-type doped semiconductor layer, according to some embodiments. That is, the top surface of insulating structure 130 can be flush with the bottom surface of first semiconductor layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. It is understood that the relative position of insulating structure 130 with respect to the semiconductor layer is not limited by the example above with respect to FIG. 1A and may vary in other examples. For example, insulating structure 130 may extend further into the semiconductor layer.

In some embodiments, insulating structure 130 does not include any contact therein (i.e., not functioning as the source contact) and thus, does not introduce parasitic capacitance and leakage current with conductive layers 116 (including word lines), according to some embodiments. In some embodiments, each insulating structure 130 includes an opening (e.g., a slit) filled with one or more dielectric materials, including, but not limited to, silicon oxide, silicon nitride, silicon oxynitride, or any combination thereof. As shown in FIG. 1A, insulating structure 130 can include a dielectric layer 160 doped with at least one of hydrogen or an isotope of hydrogen, such as protium, deuterium, tritium, hydrogen-4, hydrogen-5, etc. That is, 3D memory device 100 can include hydrogen-rich insulating structures 130 as the source for providing hydrogen or an isotope thereof to semiconductor channels 128 as described below in detail with respect to the fabrication process of 3D memory device 100.

In some embodiments, the atomic percent of the at least one of hydrogen or an isotope of hydrogen in dielectric layer 160 is not greater than about 50%, such as not greater than 50%. In some embodiments, the atomic percent of the at least one of hydrogen or an isotope of hydrogen in dielectric layer 160 is between about 0.1% and about 50%, such as between 0.1% and 50% (e.g., 0.1%, 0.2%, 0.3%, 0.4%, 0.5%, 0.6%, 0.7%, 0.8%, 0.9%, 1%, 5%, 10%, 15%, 20%, 25%, 30%, 35%, 40%, 45%, 50%, any range bounded by the lower end by any of these values, or in any range defined by any two of these values). In one example, the atomic percent of the at least one of hydrogen or an isotope of hydrogen in dielectric layer 160 may be between about 1% and about 10%, such as between 1% and 10% (e.g., 1%, 2%, 3%, 4%, 5%, 6%, 7%, 8%, 9%, 10%, any range bounded by the lower end by any of these values, or in any range defined by any two of these values). Dielectric layer 160 can include any dielectric materials that can absorb hydrogen or the isotope thereof, such as tetraethyl orthosilicate (TEOS) or silicon nitride. In some embodiments, dielectric layer 160 includes silicon nitride, which has a strong hydrogen absorption capability.

Figure 2A:
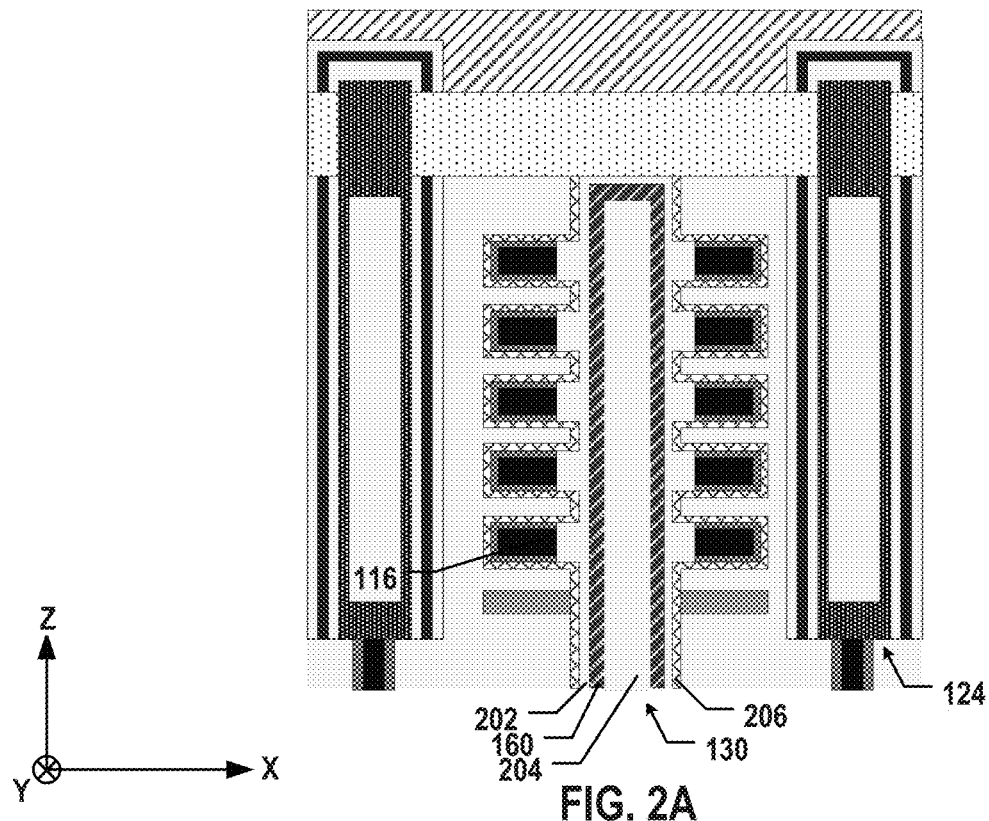
FIGS. 2A-2H illustrate side views of cross-sections of various exemplary hydrogen-rich insulating structures in the 3D memory device in FIG. 1A or 1B, according to various embodiments of the present disclosure.

It is understood that the structure of hydrogen-rich insulating structures 130 is not limited to the example shown in FIG. 1A. FIGS. 2A-2H illustrate side views of cross-sections of various exemplary hydrogen-rich insulating structures 130 in 3D memory device 100 in FIG. 1A, according to various embodiments of the present disclosure. As shown in FIG. 2A, in some embodiments, insulating structure 130 includes a first silicon oxide layer 202, dielectric layer 160, and a second silicon oxide layer 204. First silicon oxide layer 202 can be disposed laterally between dielectric layer 160 and stack conductive layers 116 of memory stack 114. In some embodiments, first silicon oxide layer 202 is disposed along the sidewalls and bottom surface of insulating structure 130 and is in contact with stack conductive layers 116 of memory stack 114. As described above, dielectric layer 160, such as a silicon nitride layer, can be doped with at least one of hydrogen or an isotope of hydrogen. In some embodiments, dielectric layer 160 is disposed over first silicon oxide layer 202, e.g., along the sidewalls and bottom surface of insulating structure 130. Second silicon oxide layer 204 can fill the remaining space of insulating structure 130 either with or without an air gap therein. In some embodiments, dielectric layer 160 is disposed laterally between first and second silicon oxide layers 202 and 204. In some embodiments, one end of insulating structure 130 is flush with the respective end of dielectric layer 160. For example, the lower end of insulating structure 130 may be flush with the lower end of dielectric layer 160. As shown in FIG. 2A, the lower ends of first and second silicon oxide layers 202 and 204 and dielectric layer 160 are flush with one another, i.e., coplanar, at the lower end of insulating structure 130.

Figure 2B:
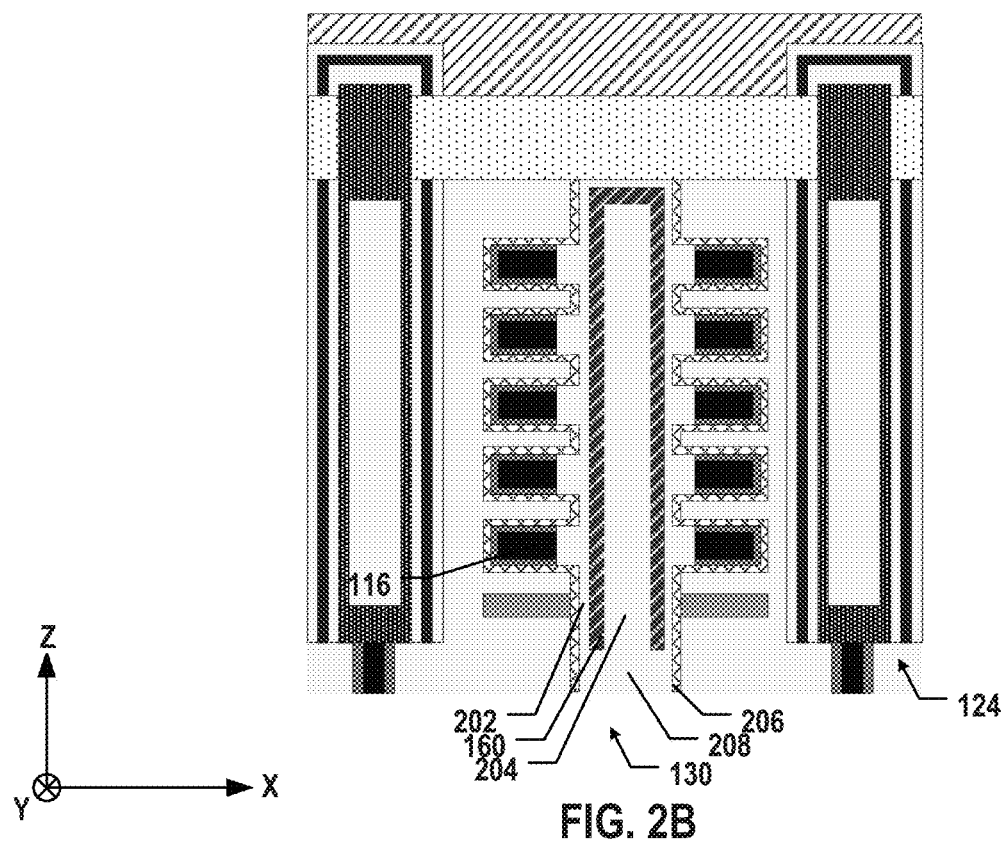

In some embodiments, one end of insulating structure 130 is not flush with the respective end of dielectric layer 160, but instead, includes a silicon oxide cap 208 at the end thereof. As shown in FIG. 2B, different from the example shown in FIG. 2A, insulating structure 130 can include silicon oxide cap 208 at the lower end thereof. In some embodiments, silicon oxide cap 208 is disposed below the lower end of dielectric layer 160 and is connected to first and second silicon oxide layers 202 and 204. As a result, silicon oxide cap 208 can prevent hydrogen or its isotope from diffusing away from the lower end of insulating structure 130, which may reduce the amount of hydrogen or its isotope that can be diffused laterally through the sidewalls of insulating structure 130 to channel structures 124.

Figure 2C:
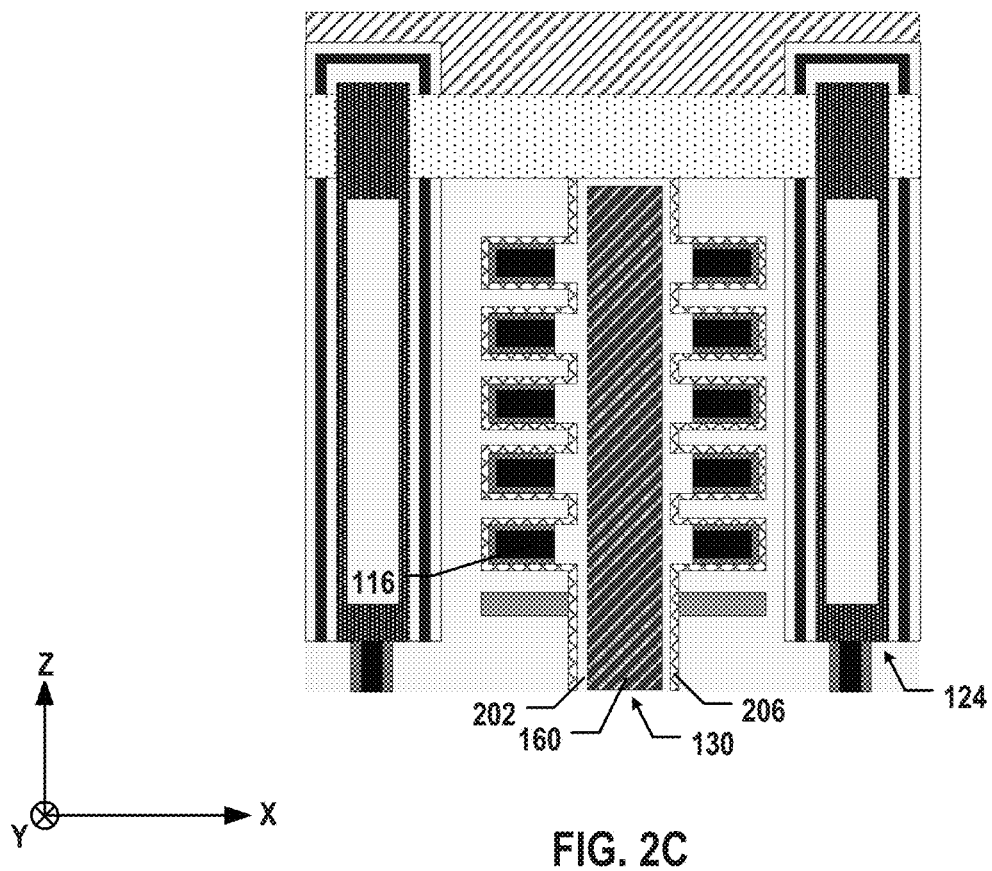
Figure 2D:
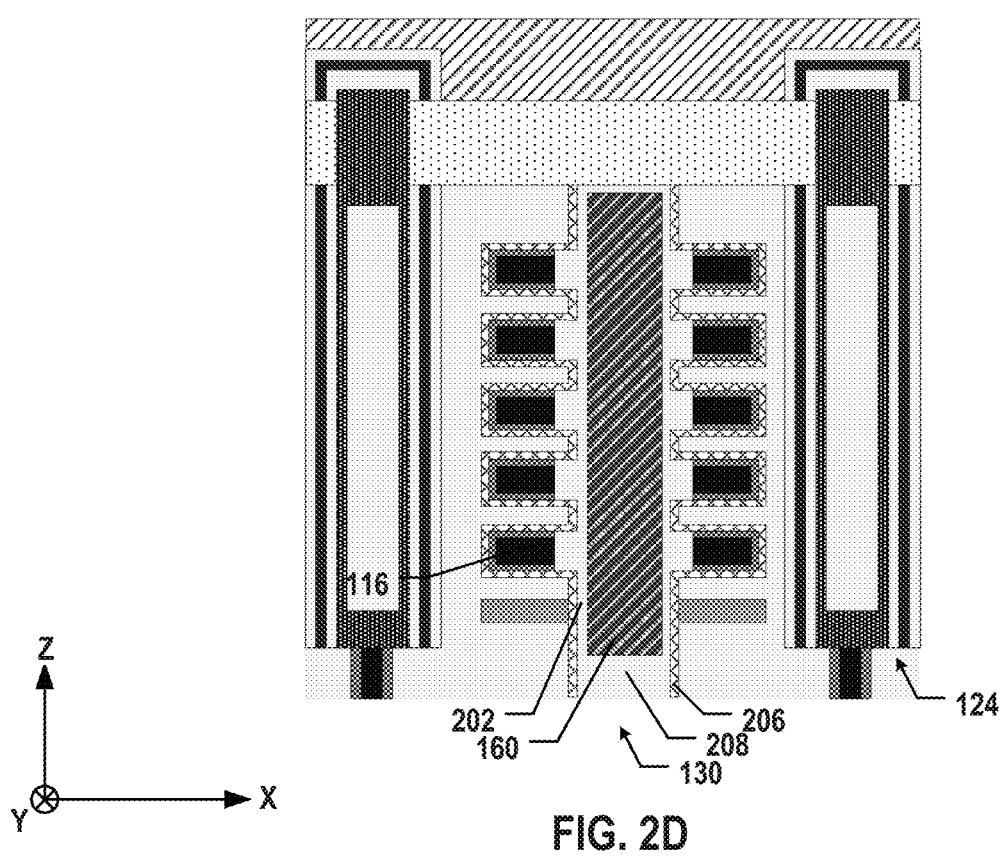

In some embodiments, insulating structure 130 does not include second silicon oxide layer 204. As shown in FIGS. 2C and 2D, dielectric layer 160 can fill the remaining space of insulating structure 130 either with or without an air gap therein, e.g., replacing second silicon oxide layer 204 in FIGS. 2A and 2B. Similar to FIGS. 2A and 2B, insulating structure 130 may or may not include silicon oxide cap 208 at the lower end thereof. Compared with the examples in FIGS. 2A and 2B, dielectric layer 160 in FIGS. 2C and 2D can have a larger volume of dielectric materials, such as silicon nitride, to absorb more hydrogen or its isotope. Moreover, by changing the material filling the remaining space of insulating structure 130, e.g., from silicon oxide to silicon nitride, the stress of insulating structure 130 may be adjusted as well, which can further adjust the wafer stress as needed.

Figure 2E:
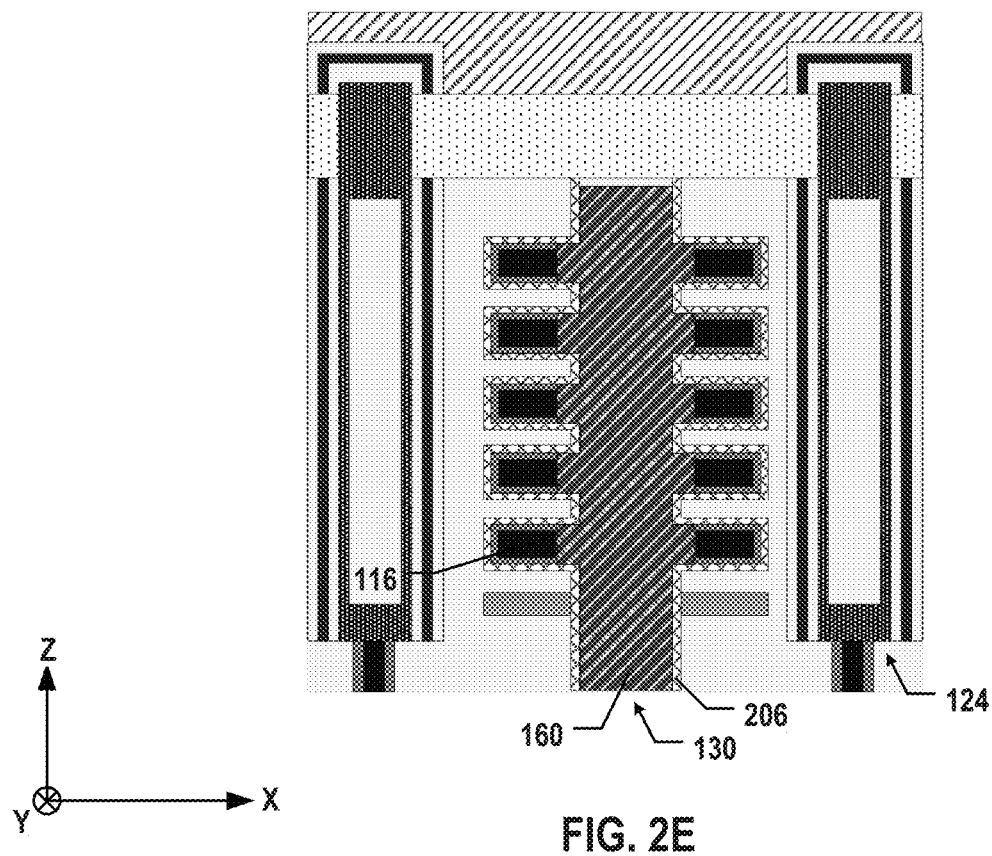
Figure 2F:
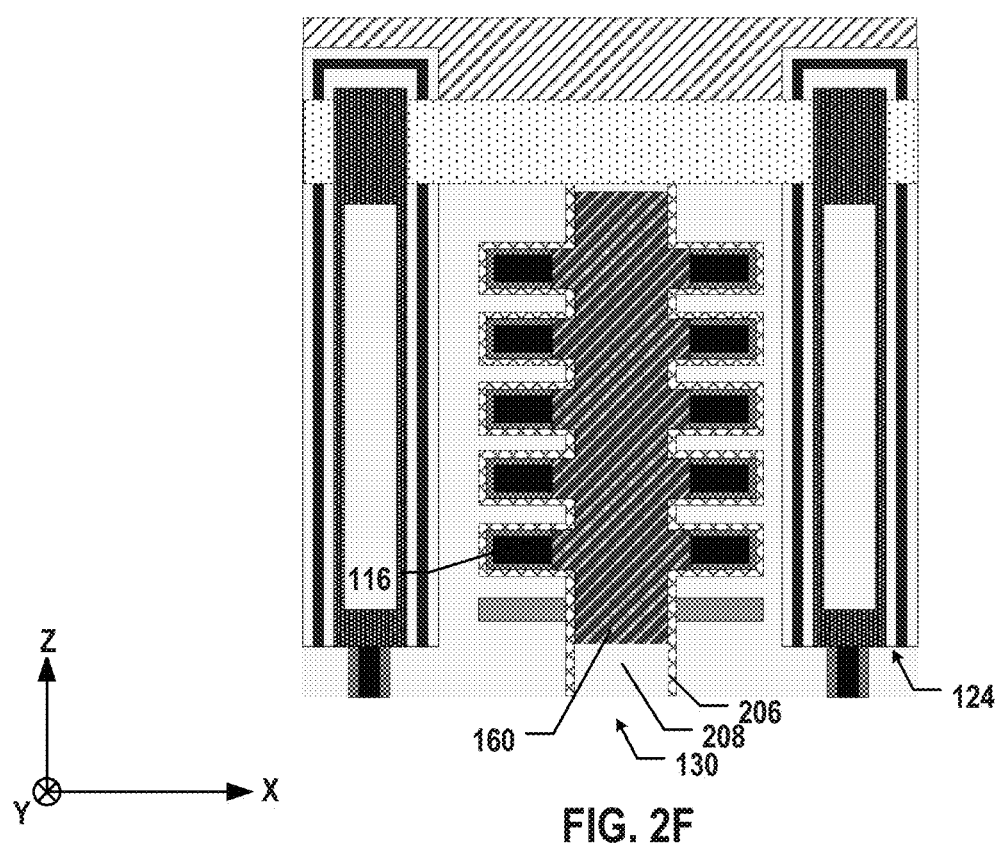

In some embodiments, insulating structure 130 does not include first and second silicon oxide layers 202 and 204. As shown in FIGS. 2E and 2F, dielectric layer 160 can fill the space of insulating structure 130 either with or without an air gap therein, e.g., replacing both first and second silicon oxide layers 202 and 204 in FIGS. 2A and 2B. That is, dielectric layer 160 can be in contact with stack conductive layers 116 of memory stack 114. Similar to FIGS. 2A and 2B, insulating structure 130 may or may not include silicon oxide cap 208 at the lower end thereof. Compared with the examples in FIGS. 2A and 2B, dielectric layer 160 in FIGS. 2E and 2F can have a larger volume of dielectric materials, such as silicon nitride, to absorb more hydrogen or its isotope. Moreover, by changing the material filling the space of insulating structure 130, e.g., from silicon oxide to silicon nitride, the stress of insulating structure 130 may be adjusted as well, which can further adjust the wafer stress as needed.

Figure 2G:
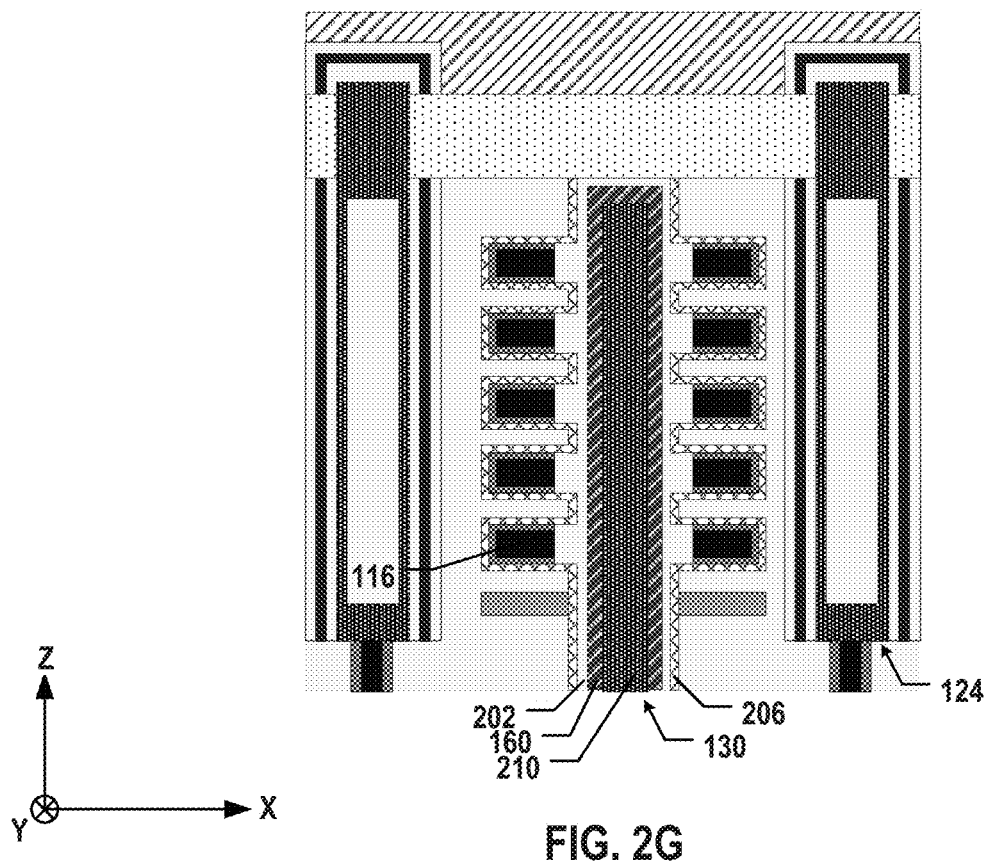
Figure 2H:
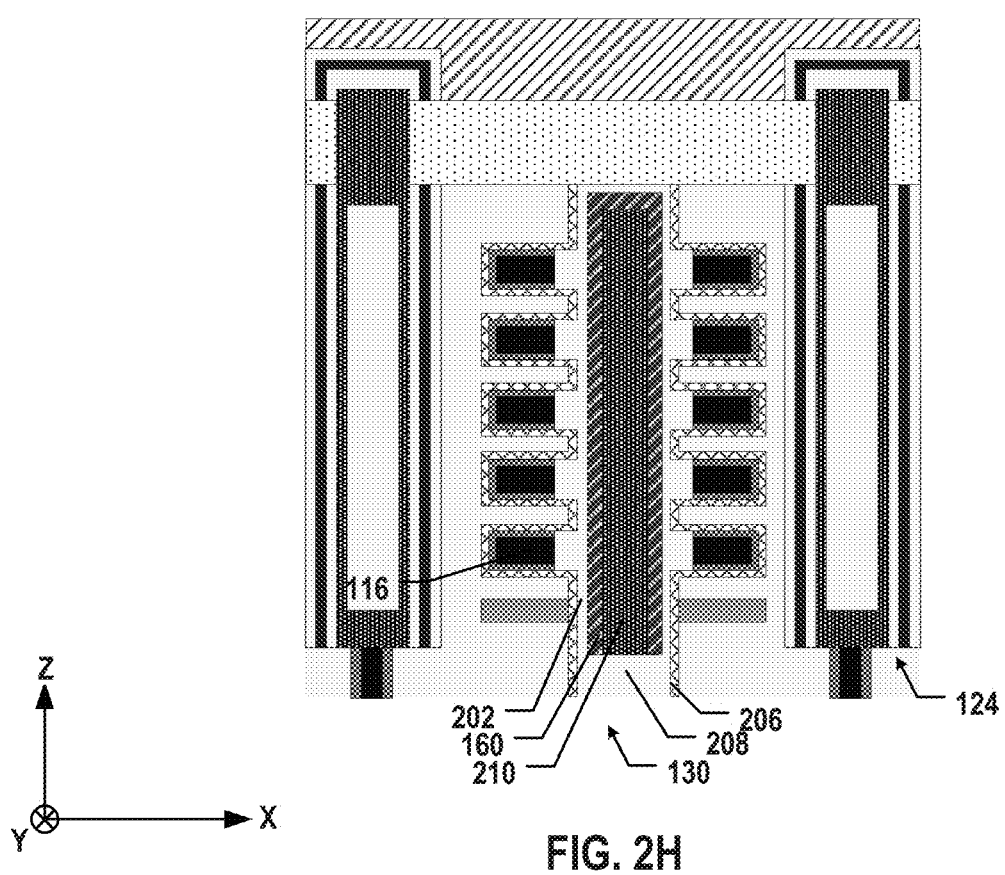

In some embodiments, insulating structure 130 does not include second silicon oxide layer 204, but instead includes a polysilicon layer 210, replacing second silicon oxide layer 204. As shown in FIGS. 2G and 2H, polysilicon layer 210 can fill the remaining space of insulating structure 130 either with or without an air gap therein, e.g., replacing second silicon oxide layer 204 in FIGS. 2A and 2B. In some embodiments, dielectric layer 160 is disposed laterally between first silicon oxide layer 202 and polysilicon layer 210. Similar to FIGS. 2A and 2B, insulating structure 130 may or may not include silicon oxide cap 208 at the lower end thereof. By changing the material filling the remaining space of insulating structure 130, e.g., from silicon oxide to polysilicon, the stress of insulating structure 130 may be adjusted as well, which can further adjust the wafer stress as needed.

It is understood that the structure of insulating structure 130 may further vary in other examples, for example, by changing the materials filling the remaining space of insulating structure 130, the number of layers in insulating structure 130, and so on, in order to adjust the amount of hydrogen or its isotope that can be absorbed by dielectric layer 160 and/or adjust the stress of insulating structure 130 as needed. It is also understood that insulating structure 130 may include additional layers, such as a high-k dielectric layer 206 shown in FIGS. 2A-2H. High-k dielectric layer 206 may extend from the gate dielectric layers of stack conductive layers 116.

Referring back to FIG. 1A, 3D memory device 100 can include a backside source contact 132 above memory stack 114 and in contact with second semiconductor layer 122. Source contact 132 and memory stack 114 (and insulating structure 130 therethrough) can be disposed on opposites sides of the semiconductor layer (e.g., a thinned substrate) and thus, viewed as a "backside" source contact. In some embodiments, source contact 132 extends further into second semiconductor layer 122 and is electrically connected to first semiconductor layer 120 and semiconductor channel 128 of channel structure 124 through second semiconductor layer 122. It is understood that the depth that source contact 132 extends into second semiconductor layer 122 may vary in different examples. In some embodiments in which second semiconductor layer 122 includes an N-well, source contact 132 is also referred to herein as an "N-well pick up." Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

Figure 3A:
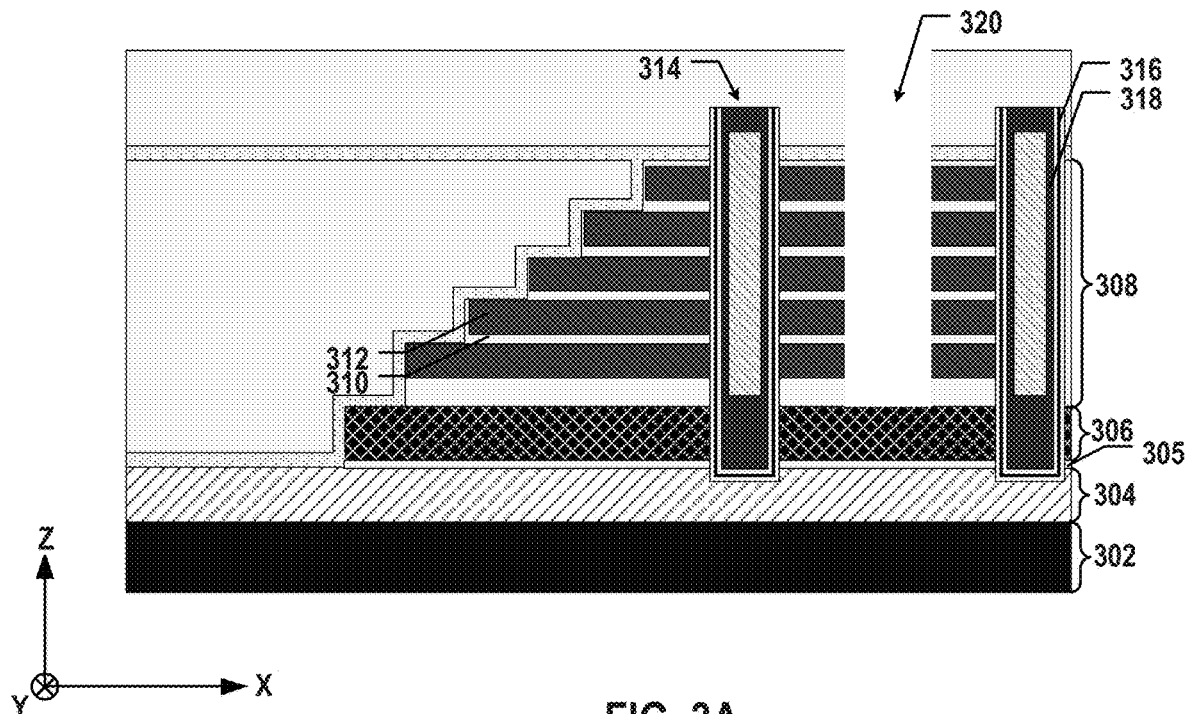
FIGS. 3A-3M illustrate a fabrication process for forming an exemplary 3D memory device with hydrogen-rich semiconductor channels, according to some embodiments of the present disclosure.
Figure 3B:
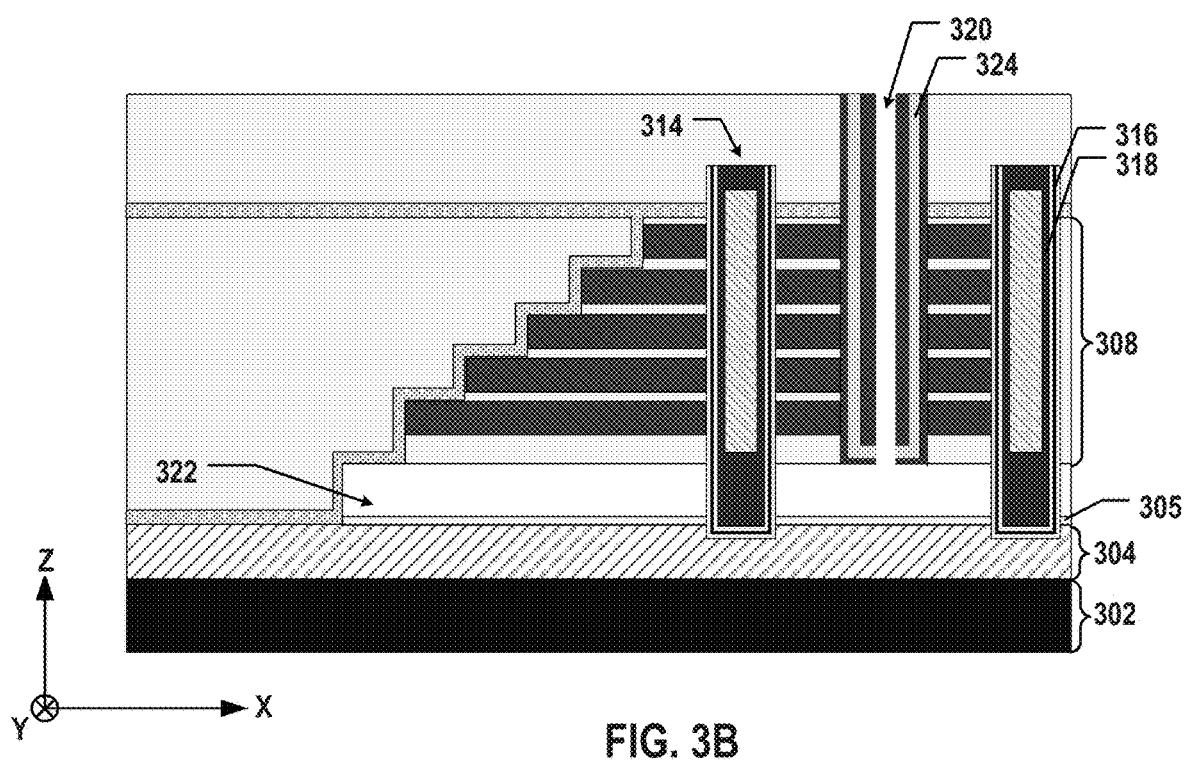
Figure 3C:
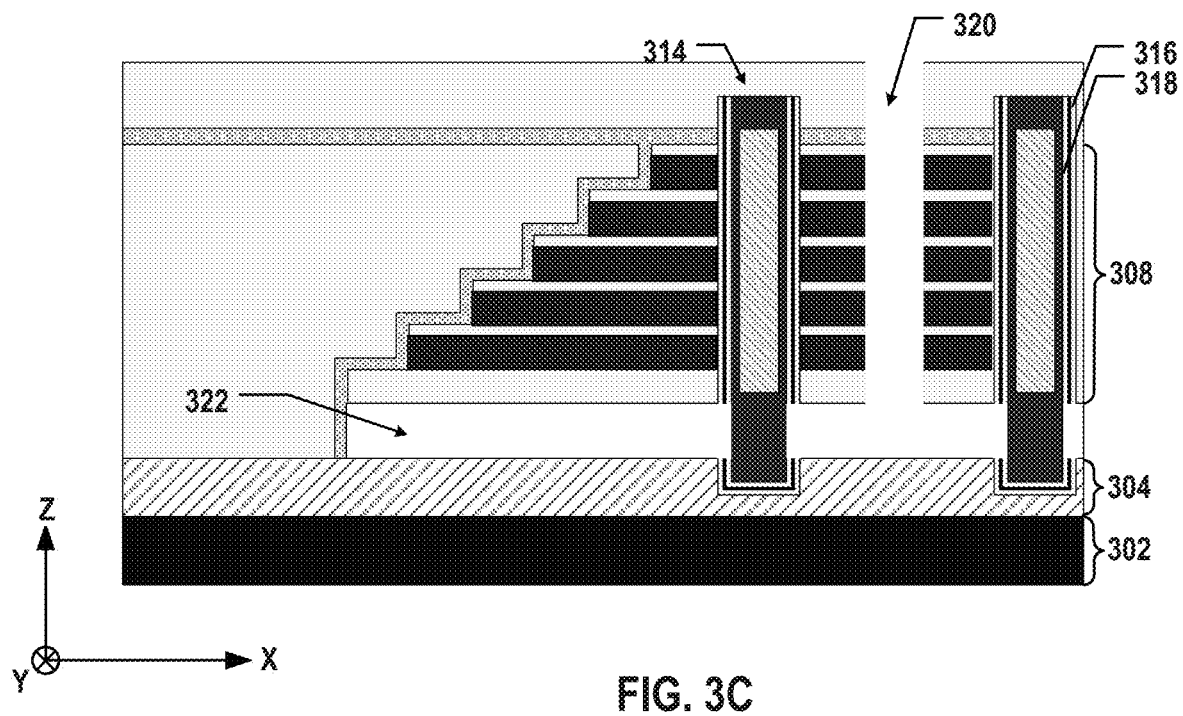
Figure 3D:
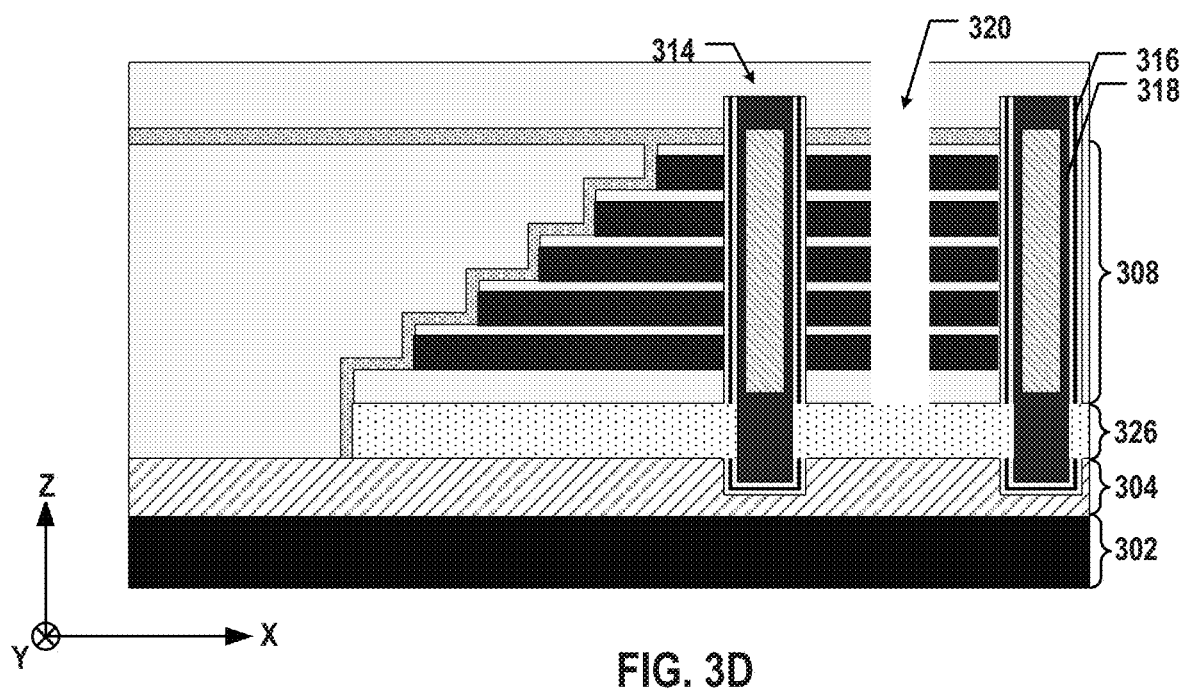

As shown in FIG. 1A, 3D memory device 100 can further include a BEOL interconnect layer 133 above and in contact with source contact 132 for pad-out, e.g., transferring electrical signals between 3D memory device 100 and external circuits. In some embodiments, interconnect layer 133 includes one or more ILD layers 134 on second semiconductor layer 122 and a redistribution layer 136 on ILD layers 134. The upper end of source contact 132 is flush with the top surface of ILD layers 134 and the bottom surface of redistribution layer 136, and source contact 132 extends vertically through ILD layers 134 into second semiconductor layer 122, according to some embodiments. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to, W, Co, Cu, Al, silicides, or any combination thereof. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through second semiconductor layer 122. As second semiconductor layer 122 can be a thinned substrate, for example, an N-well of a P-type silicon substrate, contacts 142 and 144 are through silicon contacts (TSCs), according to some embodiments. In some embodiments, contact 142 extends through second semiconductor layer 122 and ILD layers 134 to be in contact with redistribution layer 136, such that first semiconductor layer 120 is electrically connected to contact 142 through second semiconductor layer 122, source contact 132, and redistribution layer 136 of interconnect layer 133. In some embodiments, contact 144 extends through second semiconductor layer 122 and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically insulate contact 144 from second semiconductor layer 122.

In some embodiments, 3D memory device 100 further includes peripheral contacts 146 and 148 each extending vertically to second semiconductor layer 122 (e.g., an N-well of a P-type silicon substrate) outside of memory stack 114. Each peripheral contact 146 or 148 can have a depth greater than the depth of memory stack 114 to extend vertically from bonding layer 112 to second semiconductor layer 122 in a peripheral region that is outside of memory stack 114. In some embodiments, peripheral contact 146 is below and in contact with contact 142, such that first semiconductor layer 120 is electrically connected to peripheral circuit 108 in first semiconductor structure 102 through at least second semiconductor layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1A, 3D memory device 100 also includes a variety of local contacts (also known as "C1") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line local contacts 152 each below and in contact with a respective conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Figure 1B:
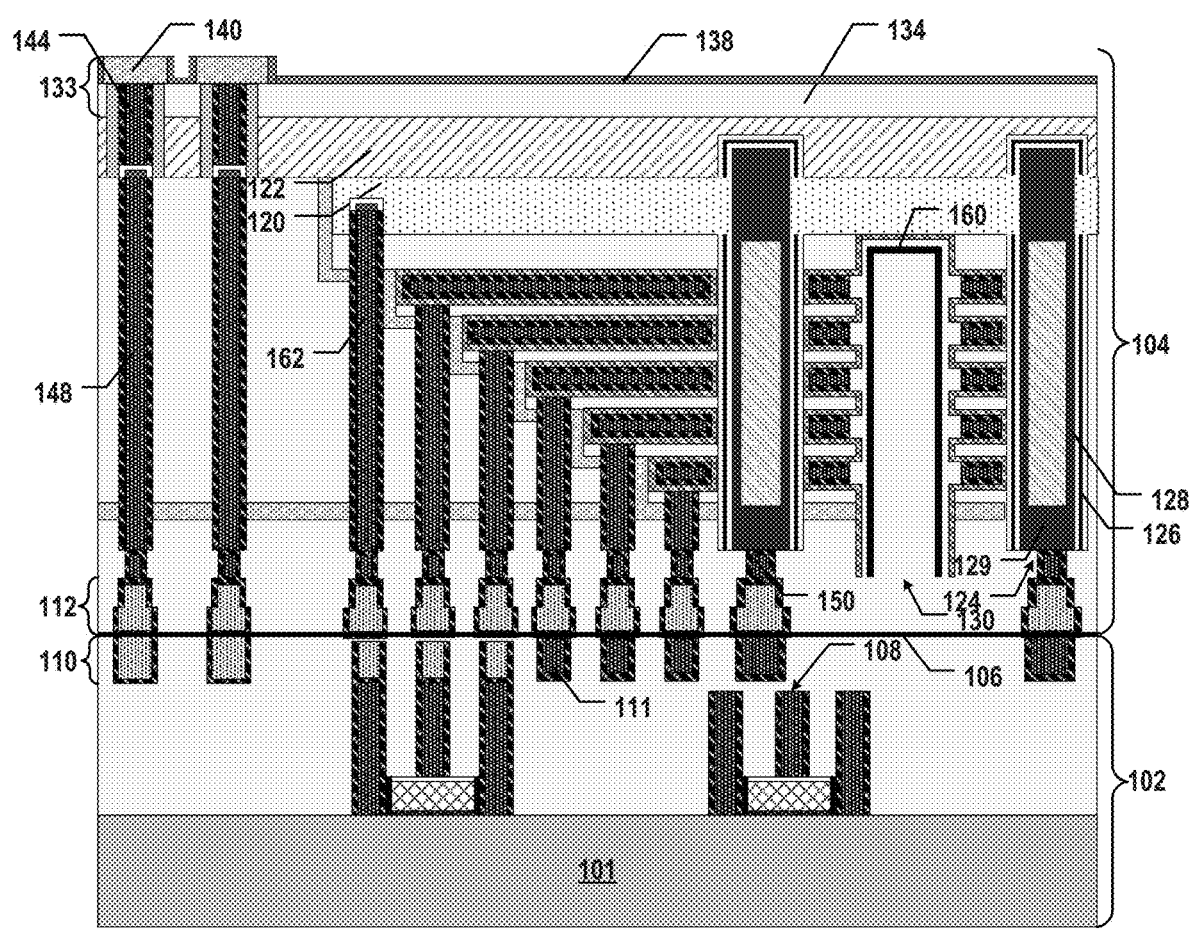
FIG. 1B illustrates a side view of a cross-section of another exemplary 3D memory device with hydrogen-rich semiconductor channels, according to some embodiments of the present disclosure.

FIG. 1B illustrates a side view of a cross-section of another exemplary 3D memory device 103 with hydrogen-rich semiconductor channels, according to some embodiments of the present disclosure. 3D memory device 103 is similar to 3D memory device 100 except that backside source contact 132 in 3D memory device 100 is replaced by a front side source contact 162 in 3D memory device 103, according to some embodiments. As shown in FIG. 1B, source contact 162 can be in contact with the semiconductor layer (e.g., second semiconductor layer 122), and source contact 162 and insulating structure 130 can be disposed on the same side, e.g., the front side, of the semiconductor layer. It is understood that the details of other same structures in both 3D memory devices 103 and 100 are not repeated for ease of description.

FIGS. 3A-3M illustrate a fabrication process for forming an exemplary 3D memory device with hydrogen-rich semiconductor channels, according to some embodiments of the present disclosure. FIG. 4 illustrates a flowchart of a method for forming an exemplary 3D memory device with hydrogen-rich semiconductor channels, according to some embodiments of the present disclosure. Examples of the 3D memory device depicted in FIGS. 3A-3M and 4 include 3D memory devices 100 and 103 depicted in FIGS. 1A and 1B. FIGS. 3A-3M and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a peripheral circuit is formed on a first substrate. The first substrate can be a silicon substrate. As illustrated in FIG. 3I, a plurality of transistors are formed on a silicon substrate 350 using a plurality of processes including, but not limited to, photolithography, etching, thin film deposition, thermal growth, implantation, chemical mechanical polishing (CMP), and any other suitable processes. In some embodiments, doped regions (not shown) are formed in silicon substrate 350 by ion implantation and/or thermal diffusion, which function, for example, as source regions and/or drain regions of the transistors. In some embodiments, isolation regions (e.g., STIs) are also formed in silicon substrate 350 by wet etching and/or dry etching and thin film deposition. The transistors can form peripheral circuits 352 on silicon substrate 350.

As illustrated in FIG. 3I, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 400 proceeds to operation 404, as illustrated in FIG. 4, in which a first semiconductor layer on a second substrate, a sacrificial layer on the first semiconductor layer, and a dielectric stack on the sacrificial layer are sequentially formed. The dielectric stack can include interleaved stack sacrificial layers and stack dielectric layers. In some embodiments, to subsequently form the sacrificial layer and the dielectric stack, polysilicon is deposited on the second semiconductor layer to form the sacrificial layer, and stack dielectric layers and stack sacrificial layers are alternatingly deposited on the sacrificial layer to form the dielectric stack.

As illustrated in FIG. 3A, an N-type doped semiconductor layer 304 is formed on a silicon substrate 302. N-type doped semiconductor layer 304 can include an N-well in a P-type silicon substrate 302 and include single crystalline silicon. N-type doped semiconductor layer 304 can be formed by doping N-type dopant(s), such as P or As, into P-type silicon substrate 302 using ion implantation and/or thermal diffusion.

As illustrated in FIG. 3A, a sacrificial layer 306 is formed on N-type doped semiconductor layer 304. Sacrificial layer 306 can be formed by depositing polysilicon or any other suitable sacrificial material (e.g., silicon nitride, carbon) that can be later selectively removed using one or more thin film deposition processes including, but not limited to, CVD, PVD, ALD, or any combination thereof. In some embodiments, a pad oxide layer 305 is formed between sacrificial layer 306 and N-type doped semiconductor layer 304 by depositing dielectric materials, such as silicon oxide, or thermal oxidation, on silicon substrate 302 prior to the formation of N-type doped semiconductor layer 304.

As illustrated in FIG. 3A, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on a sacrificial layer 306. Dielectric stack 308 includes interleaved stack sacrificial layers 312 and stack dielectric layers 310, according to some embodiments. Stack dielectric layers 310 and stack sacrificial layers 312 can be alternatively deposited on sacrificial layer 306 above silicon substrate 302 to form dielectric stack 308. In some embodiments, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. As illustrated in FIG. 3A, a staircase structure can be formed on the edge of dielectric stack 308. The staircase structure can be formed by performing a plurality of so-called "trim-etch" cycles to the dielectric layer pairs of dielectric stack 308 toward silicon substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3A.

Method 400 proceeds to operation 406, as illustrated in FIG. 4, in which a channel structure extending vertically through the dielectric stack and the sacrificial layer into the first semiconductor layer is formed. In some embodiments, to form the channel structure, a channel hole extending vertically through the dielectric stack and the sacrificial layer into the first semiconductor layer is formed, a memory film and a semiconductor channel are sequentially formed over a sidewall of the channel hole, and a channel plug is formed above and in contact with the semiconductor channel. The semiconductor channel can include polysilicon.

As illustrated in FIG. 3A, a channel hole is an opening extending vertically through dielectric stack 308 and sacrificial layer 306 into N-type doped semiconductor layer 304. In some embodiments, a plurality of openings are formed, such that each opening becomes the location for growing an individual channel structure 314 in the later process. In some embodiments, fabrication processes for forming the channel hole of channel structure 314 include wet etching and/or dry etching, such as deep-ion reactive etching (DRIE). In some embodiments, the channel hole of channel structure 314 extends further through the top portion of N-type doped semiconductor layer 304. The etching process through dielectric stack 308 and sacrificial layer 306 may continue to etch part of N-type doped semiconductor layer 304. In some embodiments, a separate etching process is used to etch part of N-type doped semiconductor layer 304 after etching through dielectric stack 308 and sacrificial layer 306.

As illustrated in FIG. 3A, a memory film 316 (including a blocking layer, a storage layer, and a tunneling layer) and a semiconductor channel 318 are sequentially formed in this order along sidewalls and the bottom surface of the channel hole. In some embodiments, memory film 316 is first deposited along the sidewalls and bottom surface of the channel hole, and semiconductor channel 318 is then deposited over memory film 316. The blocking layer, storage layer, and tunneling layer can be subsequently deposited in this order using one or more thin film deposition processes, such as ALD, CVD, PVD, any other suitable processes, or any combination thereof, to form memory film 316. Semiconductor channel 318 can then be formed by depositing a semiconductor material, such as polysilicon, over the tunneling layer of memory film 316 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 316 and semiconductor channel 318.

As illustrated in FIG. 3A, a capping layer is formed in the channel hole and over semiconductor channel 318 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some embodiments, parts of memory film 316, semiconductor channel 318, and the capping layer that are on the top surface of dielectric stack 308 are removed and planarized by CMP, wet etching, and/or dry etching. A recess then can be formed in the top portion of the channel hole by wet etching and/or drying etching parts of semiconductor channel 318 and the capping layer in the top portion of the channel hole. The channel plug can then be formed by depositing semiconductor materials, such as polysilicon, into the recess by one or more thin film deposition processes, such as CVD, PVD, ALD, or any combination thereof. Channel structure 314 is thereby formed through dielectric stack 308 and sacrificial layer 306 into N-type doped semiconductor layer 304.

Method 400 proceeds to operation 408, as illustrated in FIG. 4, in which an opening extending vertically through the dielectric stack is formed, for example, to expose part of the sacrificial layer. As illustrated in FIG. 3A, a slit 320 is an opening that extends vertically through dielectric stack 308 and exposes part of sacrificial layer 306. In some embodiments, fabrication processes for forming slit 320 include wet etching and/or dry etching, such as DRIE. In some embodiments, slit 320 extends further into the top portion of sacrificial layer 306. The etching process through dielectric stack 308 may not stop at the top surface of sacrificial layer 306 and may continue to etch part of sacrificial layer 306.

Method 400 proceeds to operation 410, as illustrated in FIG. 4, in which the sacrificial layer is replaced with a second semiconductor layer through the opening. As illustrated in FIG. 3B, sacrificial layer 306 (shown in FIG. 3A) is removed by wet etching and/or dry etching to form a cavity 322. In some embodiments, sacrificial layer 306 is wet etched by applying a wet etchant through slit 320, which can be stopped by pad oxide layer 305 between sacrificial layer 306 and N-type doped semiconductor layer 304. That is, the removal of sacrificial layer 306 does not affect N-type doped semiconductor layer 304, according to some embodiments. In some embodiments, prior to the removal of sacrificial layer 306, a spacer 324 is formed along the sidewall of slit 320. Spacer 324 can be formed by depositing dielectric materials, such as silicon nitride, silicon oxide, and silicon nitride, into slit 320 using one or more thin film deposition processes, such as CVD, PVD, ALD, or any combination thereof.

As illustrated in FIG. 3C, part of memory film 316 of channel structure 314 exposed in cavity 322 is removed to expose part of semiconductor channel 318 of channel structure 314 abutting cavity 322. In some embodiments, parts of the blocking layer (e.g., including silicon oxide), storage layer (e.g., including silicon nitride), and tunneling layer (e.g., including silicon oxide) are etched by applying etchants through slit 320 and cavity 322, for example, phosphoric acid for etching silicon nitride and hydrofluoric acid for etching silicon oxide. The etching can be stopped by semiconductor channel 318 of channel structure 314. Spacer 324 including dielectric materials (shown in FIG. 3B) can also protect dielectric stack 308 from the etching of memory film 316 and can be removed by the etchants in the same step as removing part of memory film 316. Similarly, pad oxide layer 305 (shown in FIG. 3B) on N-type doped semiconductor layer 304 can be removed as well by the same step as removing part of memory film 316.

As illustrated in FIG. 3D, an N-type doped semiconductor layer 326 is formed above and in contact with N-type doped semiconductor layer 304. In some embodiments, N-type doped semiconductor layer 326 is formed by depositing polysilicon into cavity 322 (shown in FIG. 3C) through slit 320 using one or more thin film deposition processes, such as CVD, PVD, ALD, or any combination thereof. In some embodiments, in-situ doping of N-type dopants, such as P or As, is performed when depositing polysilicon to form an N-type doped polysilicon layer as N-type doped semiconductor layer 326. N-type doped semiconductor layer 326 can fill cavity 322 to be in contact with the exposed part of semiconductor channel 318 of channel structure 314.

Method 400 proceeds to operation 412, as illustrated in FIG. 4, in which the dielectric stack is replaced with a memory stack, for example, using the so-called "gate replacement" process, such that the channel structure extends vertically through the memory stack and the first semiconductor layer into the second semiconductor layer. In some embodiments, to replace the dielectric stack with the memory stack, the stack sacrificial layers are replaced with stack conductive layers through the opening. In some embodiments, the memory stack includes interleaved stack conductive layers and stack dielectric layers. The channel structure extending vertically through the memory stack into the semiconductor layer on the second substrate is thereby formed, according to some embodiments.

Figure 3E:
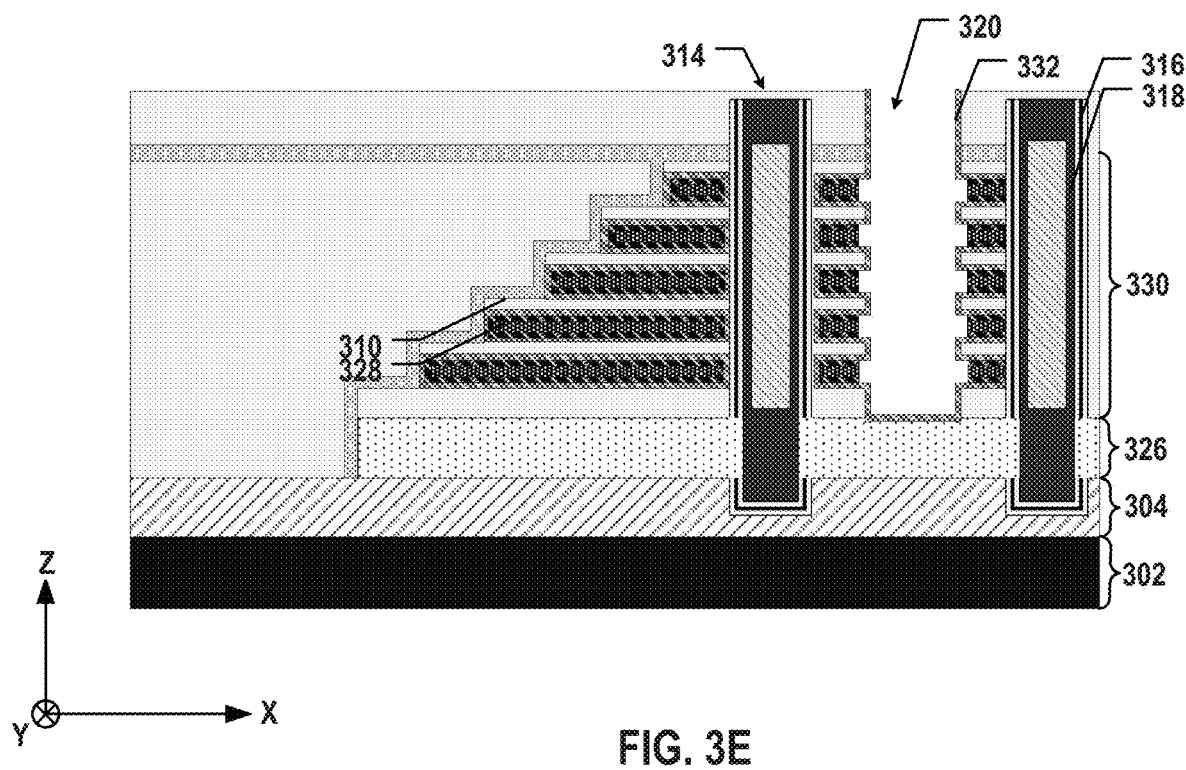
Figure 4:
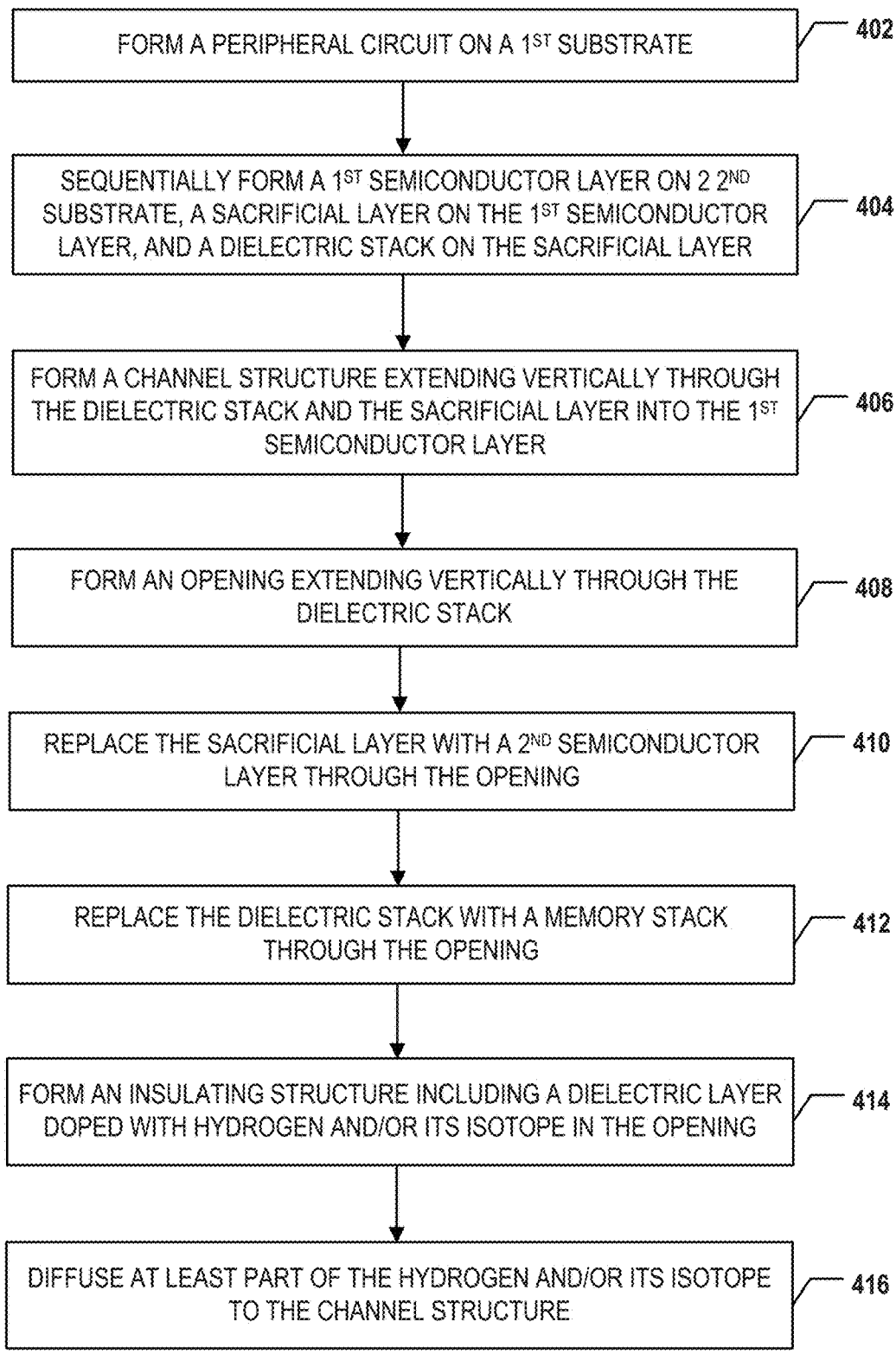
FIG. 4 illustrates a flowchart of a method for forming an exemplary 3D memory device with hydrogen-rich semiconductor channels, according to some embodiments of the present disclosure.

As illustrated in FIG. 3E, stack sacrificial layers 312 (shown in FIG. 3A) are replaced with stack conductive layers 328, and a memory stack 330 including interleaved stack conductive layers 328 and stack dielectric layers 310 is thereby formed, replacing dielectric stack 308 (shown in FIG. 3A). In some embodiments, lateral recesses (not shown) are first formed by removing stack sacrificial layers 312 through slit 320. In some embodiments, stack sacrificial layers 312 are removed by applying etchants through slit 320, creating the lateral recesses interleaved between stack dielectric layers 310. The etchants can include any suitable etchants that etch stack sacrificial layers 312 selective to stack dielectric layers 310. As illustrated in FIG. 3E, stack conductive layers 328 (including gate electrodes and adhesive layers) are deposited into the lateral recesses through slit 320. In some embodiments, a gate dielectric layer 332 is deposited into the lateral recesses prior to stack conductive layers 328, such that stack conductive layers 328 are deposited on the gate dielectric layer. Stack conductive layers 328, such as metal layers, can be deposited using one or more thin film deposition processes, such as ALD, CVD, PVD, any other suitable processes, or any combination thereof. In some embodiments, gate dielectric layer 332, such as a high-k dielectric layer, is formed along the sidewall and at the bottom of slit 320 as well. Channel structure 314 extending vertically through memory stack 330 into a semiconductor layer (including N-type doped semiconductor layers 304 and 306) on silicon substrate 302 is thereby formed, according to some embodiments.

Method 400 proceeds to operation 414, as illustrated in FIG. 4, in which an insulating structure extending vertically through the memory stack is formed in the opening. The insulating structure can include a dielectric layer doped with at least one of hydrogen or an isotope of hydrogen. In some embodiments, to form the insulating structure, a first layer of silicon oxide, the dielectric layer, and a second layer of silicon oxide are sequentially formed in the opening. In some embodiments, to form the insulating structure, a layer of silicon oxide, the dielectric layer, and a layer of polysilicon are sequentially formed in the opening. In some embodiments, to form the insulating structure, a layer of silicon oxide and the dielectric layer are sequentially formed in the opening. In some embodiments, to form the dielectric layer, a layer of silicon nitride is deposited, and the layer of silicon nitride is in situ doped with the least one of hydrogen or an isotope of hydrogen. In some embodiments, to form the dielectric layer, a layer of silicon nitride is deposited, and the layer of silicon nitride is annealed in the presence of the least one of hydrogen or an isotope of hydrogen after the deposition. In some embodiments, to form the insulating structure, a silicon oxide cap is formed at an upper end of the insulating structure. In some embodiments, to form the silicon oxide cap, a top portion of at least the dielectric layer is etched back to form a recess, and a layer of silicon oxide is deposited to fill the recess.

Figure 3F:
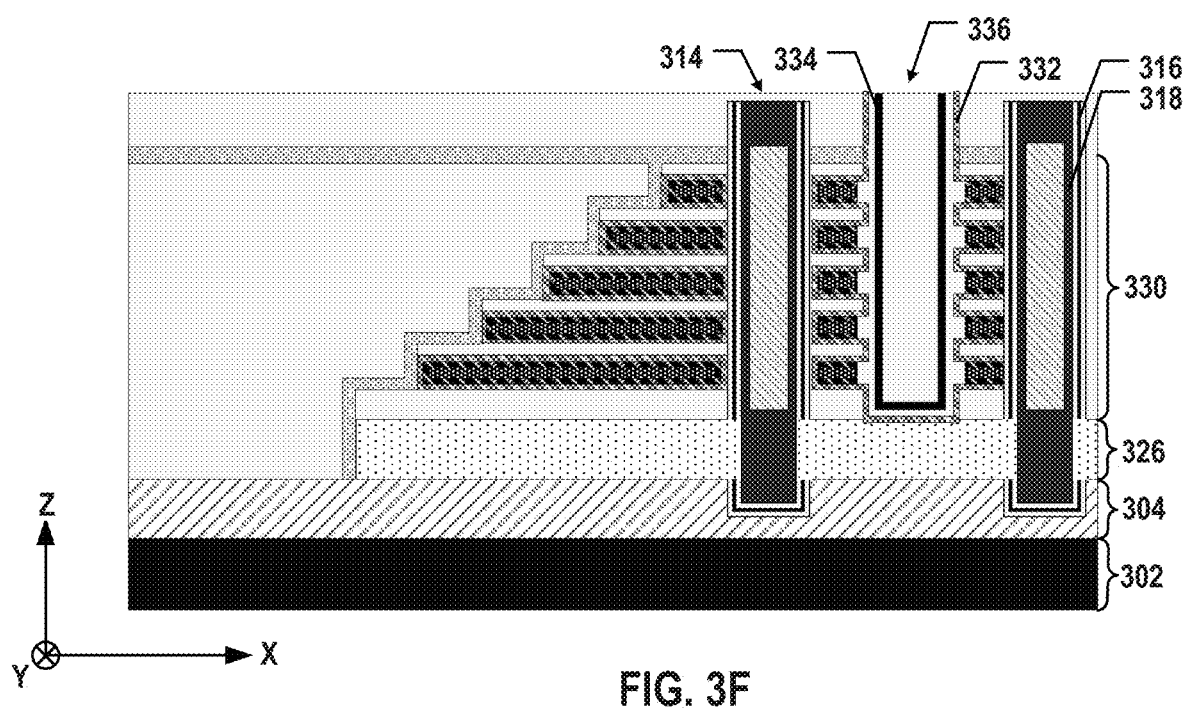

As illustrated in FIG. 3F, an insulating structure 336 extending vertically through memory stack 330 is formed, stopping on the top surface of N-type doped semiconductor layer 326. Insulating structure 336 can include a dielectric layer 334 doped with least one of hydrogen or an isotope of hydrogen, such as protium, deuterium, tritium, hydrogen-4, hydrogen-5, etc. Referring to FIGS. 2A and 2B, insulating structure 130 (e.g., insulating structure 336 in FIG. 3F) can be formed by sequentially depositing a first silicon oxide layer 202, dielectric layer 160 (e.g., dielectric layer 334 in FIG. 3F), and a second silicon oxide layer 204 into slit 320 to fully or partially fill slit 320 (with or without an air gap) using one or more thin film deposition processes, such as ALD, CVD, PVD, any other suitable processes, or any combination thereof. Referring to FIGS. 2C and 2D, insulating structure 130 (e.g., insulating structure 336 in FIG. 3F) can be formed by sequentially depositing a first silicon oxide layer 202 and dielectric layer 160 (e.g., dielectric layer 334 in FIG. 3F) into slit 320 to fully or partially fill slit 320 (with or without an air gap) using one or more thin film deposition processes, such as ALD, CVD, PVD, any other suitable processes, or any combination thereof. Referring to FIGS. 2E and 2F, insulating structure 130 (e.g., insulating structure 336 in FIG. 3F) can be formed by depositing dielectric layer 160 (e.g., dielectric layer 334 in FIG. 3F) into slit 320 to fully or partially fill slit 320 (with or without an air gap) using one or more thin film deposition processes, such as ALD, CVD, PVD, any other suitable processes, or any combination thereof. Referring to FIGS. 2G and 2H, insulating structure 130 (e.g., insulating structure 336 in FIG. 3F) can be formed by sequentially depositing a first silicon oxide layer 202, dielectric layer 160 (e.g., dielectric layer 334 in FIG. 3F), and a polysilicon layer 210 into slit 320 to fully or partially fill slit 320 (with or without an air gap) using one or more thin film deposition processes, such as ALD, CVD, PVD, any other suitable processes, or any combination thereof.

In some embodiments, to form dielectric layer 160 (e.g., dielectric layer 334 in FIG. 3F), a silicon nitride layer is deposited over first silicon oxide layer 202 along the sidewalls and bottom surface of slit 320 (e.g., in FIGS. 2A-2D, 2G, and 2J). In one example, hydrogen or its isotope may be in situ doped into the silicon nitride layer during the deposition, such as CVD. In another example, after depositing the silicon nitride layer, the silicon nitride layer may be annealed in the presence of hydrogen or its isotope, for example, with hydrogen gas flowing through a furnace chamber. In some embodiments, the atomic percent of the doped hydrogen or its isotope in dielectric layer 160 is controlled to be greater than about 50% after the formation of dielectric layer 160.

Referring to FIGS. 2B, 2D, 2F, and 2H, in some embodiments, silicon oxide cap 208 is formed at one end of insulating structure 130. Silicon oxide cap 208 can be formed by first etching back the top portion of at least dielectric layer 160 (and one or more of first and second silicon oxide layers 202 and 204 and polysilicon layer 210 in various examples) to form a recess, and depositing a layer of silicon oxide to fill the recess. In some embodiments, a CMP process is performed to planarize the top surface of the layer of silicon oxide to form the silicon oxide cap 208. Referring back to FIG. 3F, an insulating structure 336 including dielectric layer 334 doped with hydrogen or its isotope is thereby formed in slit 320 (shown in FIG. 3E).

Method 400 proceeds to operation 416, as illustrated in FIG. 4, in which at least part of the at least one of hydrogen or an isotope of hydrogen is diffused to the channel structure. In some embodiments, the at least part of the at least one of hydrogen or an isotope of hydrogen is diffused from the dielectric layer to the semiconductor channel. During any thermal processes after the formation of insulating structure 336 having hydrogen-rich dielectric layer 334, the hydrogen or its isotope can be diffused from dielectric layer 334 through the sidewalls of insulating structure 336 to the semiconductor channel of channel structure 314 to dope the semiconductor channel, for example, polysilicon, with hydrogen or its isotope. The doped hydrogen or its isotope can form H—Si covalent bonds with the dangling bonds in the polysilicon semiconductor channel to reduce the dangling bonds therein, thereby improving the carrier mobility and adjusting the stress of channel structure 314. The atomic percent of the hydrogen or its isotope in dielectric layer 334 can thus be reduced after diffusion, for example, to be not greater than 50%, such as between 1% and 10%. It is understood that no additional thermal process may be added to the fabrication process flow to diffuse the hydrogen or its isotope. Instead, any existing processes after the formation of insulating structure 336 in the fabrication process flow may cause the diffusion of the hydrogen or its isotope, such as the various processes described below for illustrative purposes only.

Figure 3G:
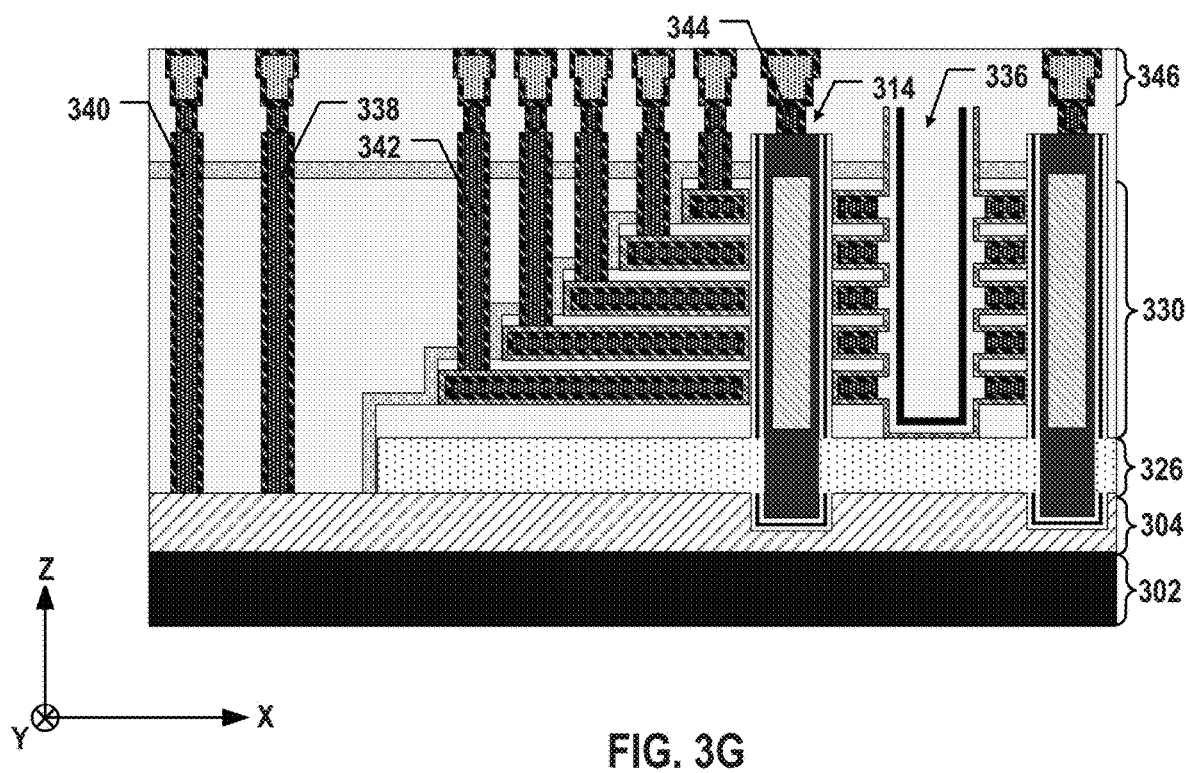

As illustrated in FIG. 3G, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

Figure 3H:
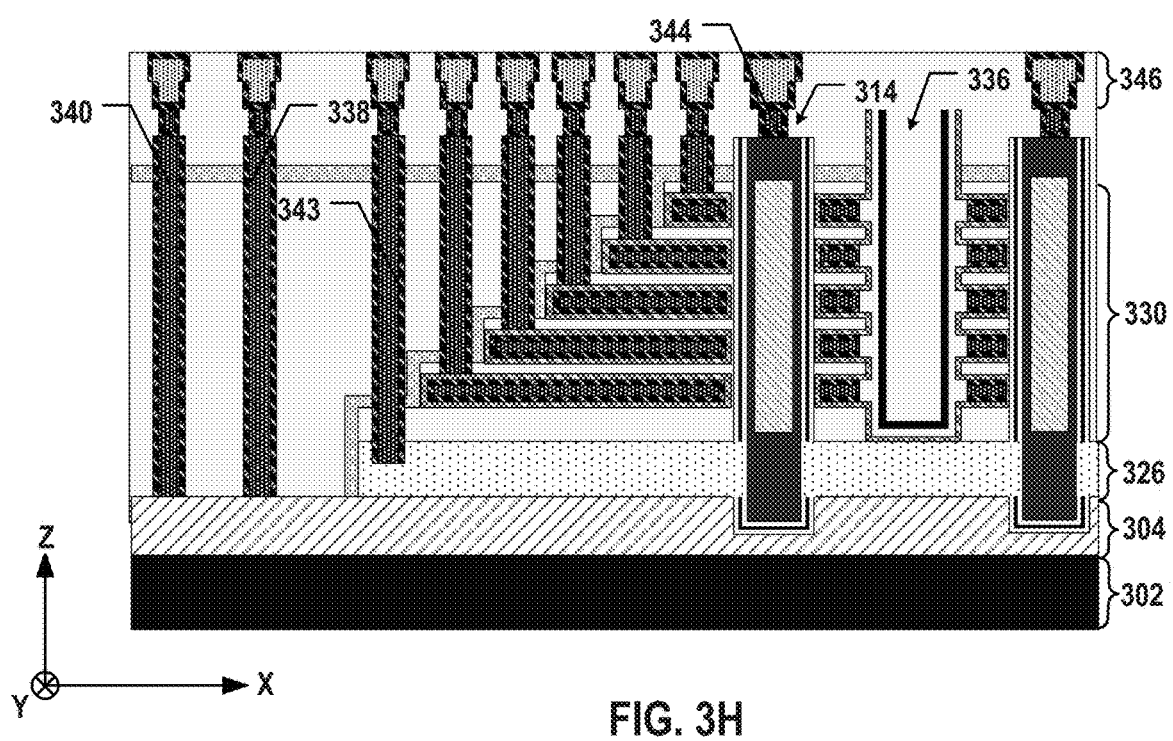
Figure 3I:
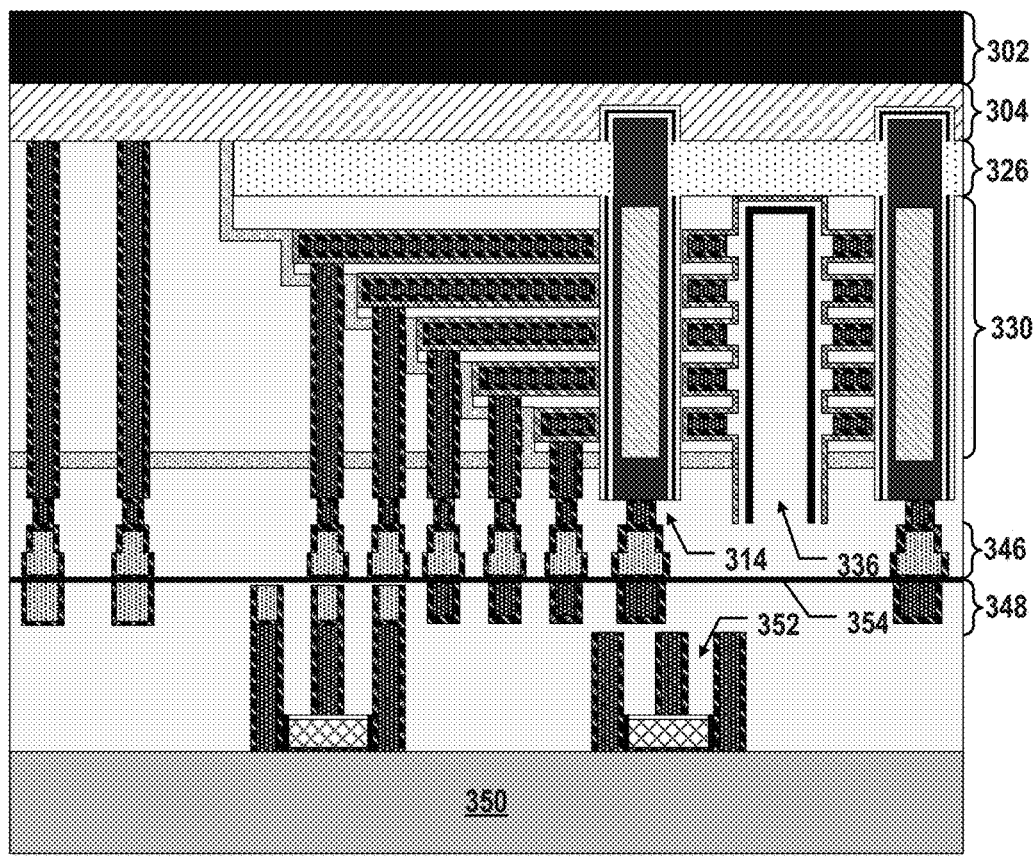
Figure 3I:
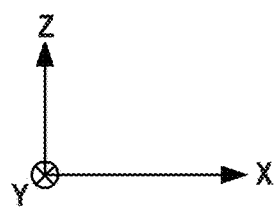

As illustrated in FIG. 3H, in some embodiments, a front side source contact 343 is formed in the same processes for forming word line local contacts 342. Front side source contact 343 can be in contact with N-type doped semiconductor layers 326.

As illustrated in FIGS. 3G and 3H, a bonding layer 346 is formed above channel local contacts 344, word line local contacts 342, and peripheral contacts 338 and 340 (and source contact 343 in FIG. 3H). Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

As illustrated in FIG. 3I, silicon substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between silicon substrates 302 and 350, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352.

Figure 3J:
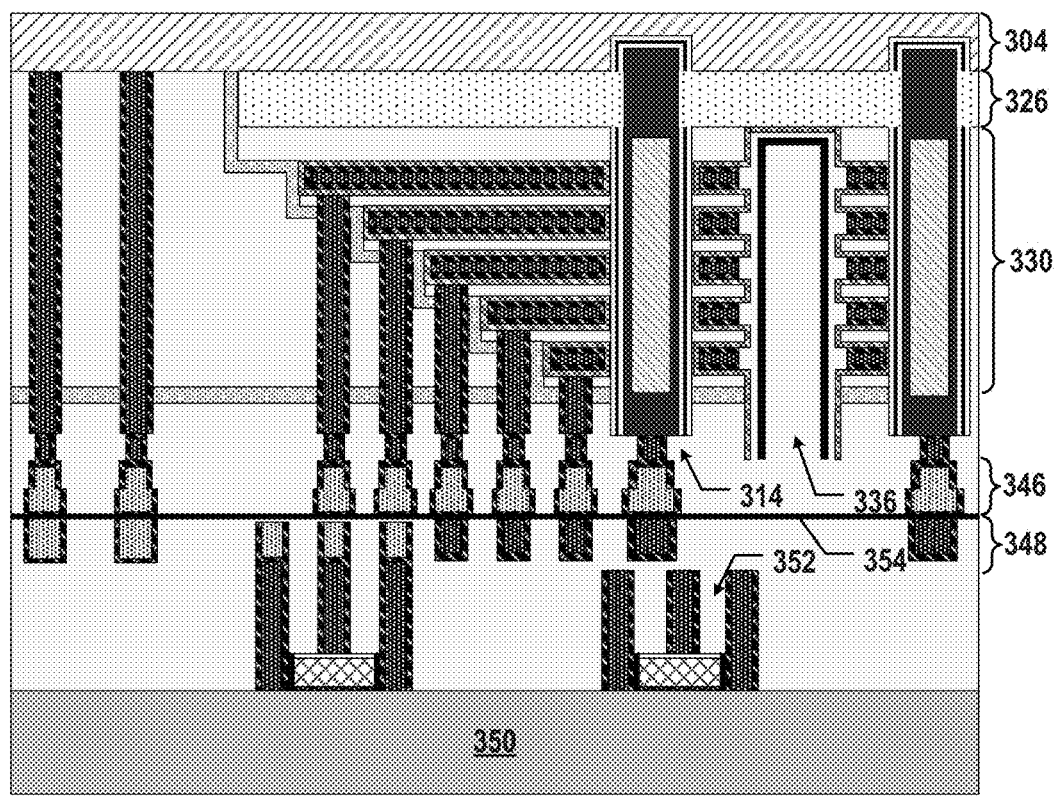
Figure 3J:
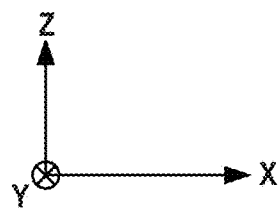

As illustrated in FIG. 3J, silicon substrate 302 (shown in FIG. 3I) is thinned from the backside to expose N-type doped semiconductor layer 304. Silicon substrate 302 can be thinned using CMP, grinding, dry etching, and/or wet etching. In some embodiments, the CMP process is performed to thin silicon substrate 302 until reaching the top surface of N-type doped semiconductor layer 304.

Figure 3K:
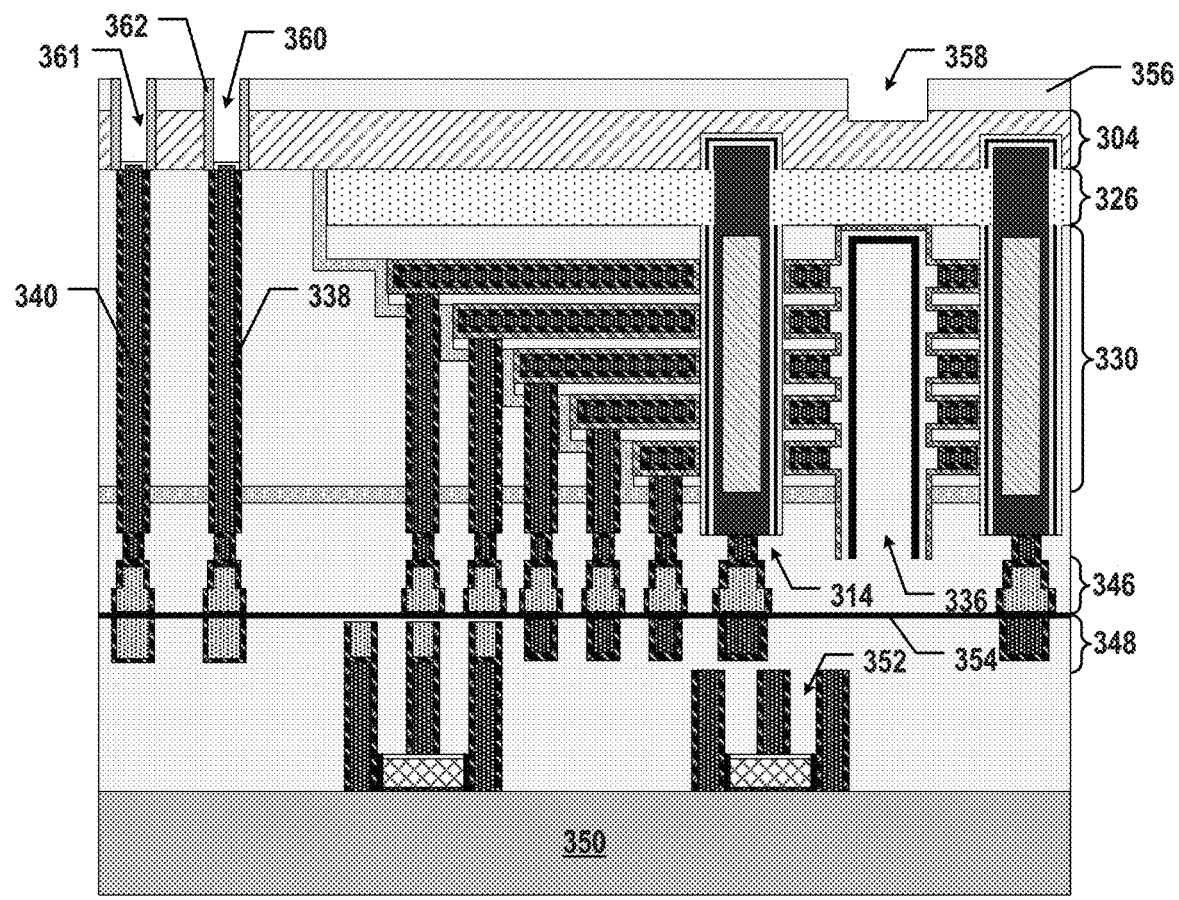

As illustrated in FIG. 3K, one or more ILD layers 356 are formed on N-type doped semiconductor layer 304. ILD layers 356 can be formed by depositing dielectric materials on the top surface of N-type doped semiconductor layer 304 using one or more thin film deposition processes, such as ALD, CVD, PVD, any other suitable processes, or any combination thereof. As illustrated in FIG. 3K, a source contact opening 358 is formed through ILD layers 356 into N-type doped semiconductor layer 304. In some embodiments, source contact opening 358 is formed using wet etching and/or dry etching, such as RIE. In some embodiments, source contact opening 358 extends further into the top portion of N-type doped semiconductor layer 304. The etching process through ILD layers 356 may continue to etch part of N-type doped semiconductor layer 304. In some embodiments, a separate etching process is used to etch part of N-type doped semiconductor layer 304 after etching through ILD layers 356. In some embodiments, source contact opening 358 is patterned using lithography to be aligned with insulating structure 336 at opposite sides of N-type doped semiconductor layer 304.

Figure 3L:
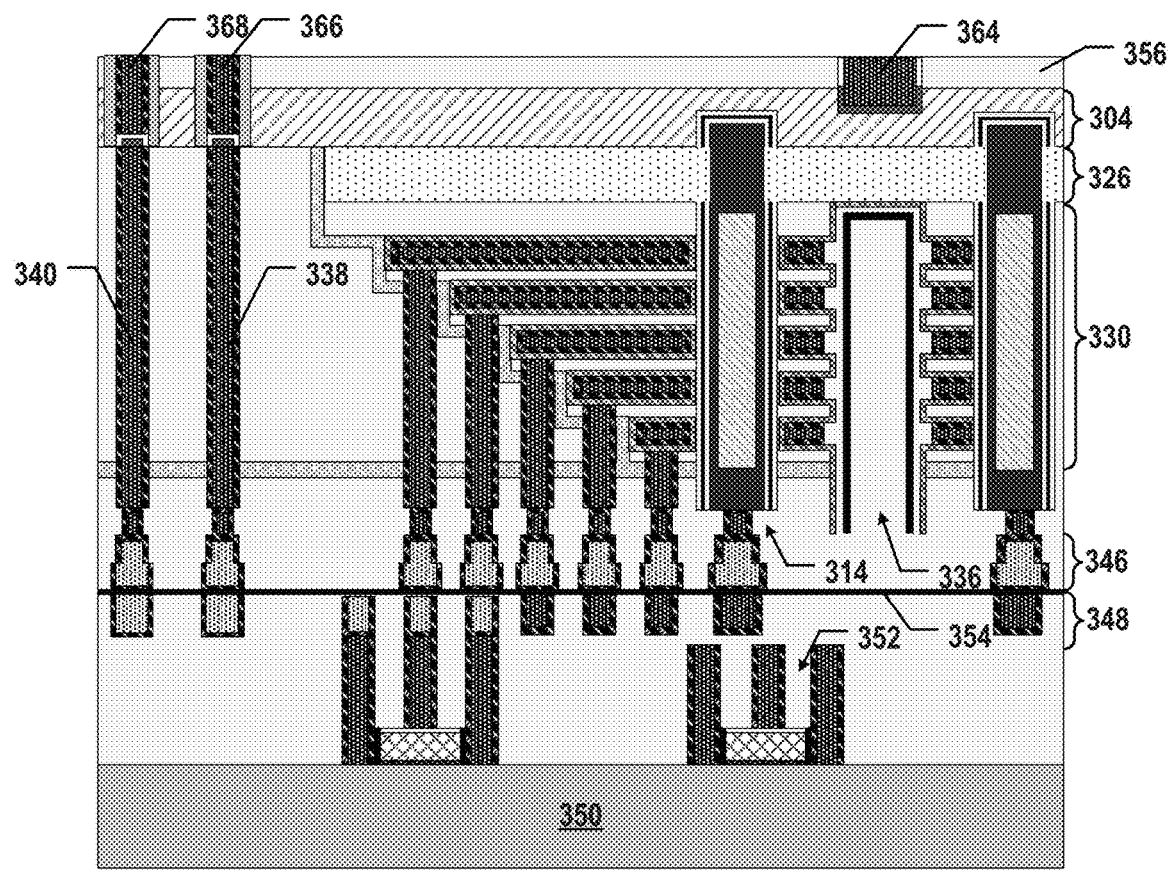

As illustrated in FIG. 3L, a source contact 364 is formed in source contact opening 358 (shown in FIG. 3K) at the backside of N-type doped semiconductor layer 304. Source contact 364 is above memory stack 330 and in contact with N-type doped semiconductor layer 304, according to some embodiments. In some embodiments, one or more conductive materials are deposited into source contact opening 358 using one or more thin film deposition processes, such as ALD, CVD, PVD, any other suitable processes, or any combination thereof, to fill source contact opening 358 with an adhesive layer (e.g., TiN) and a conductor layer (e.g., W). A planarization process, such as CMP, can then be performed to remove the excess conductive materials, such that the top surface of source contact 364 is flush with the top surface of ILD layers 356. In some embodiments, as source contact opening 358 is aligned with insulating structure 336, backside source contact 364 is aligned with insulating structure 336 as well.

Figure 3M:
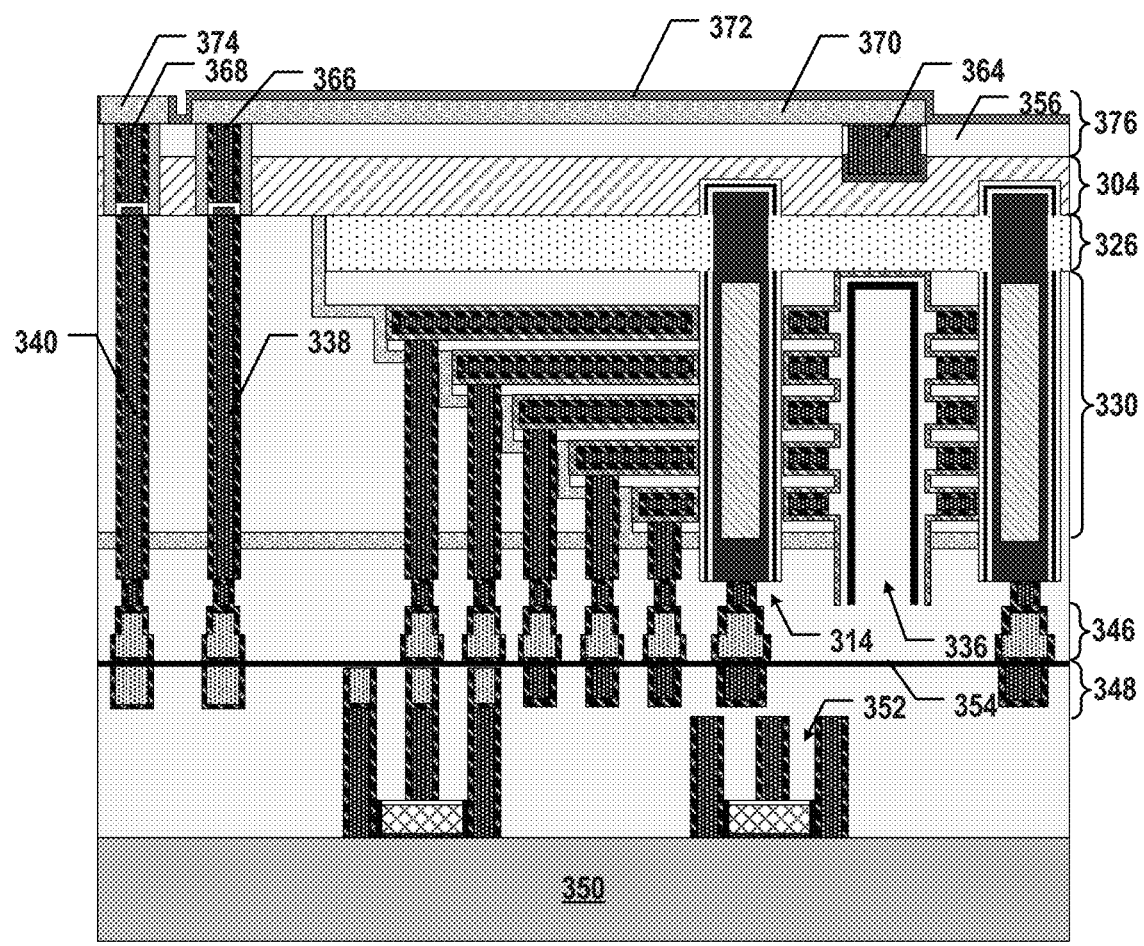

As illustrated in FIG. 3M, a redistribution layer 370 is formed above and in contact with source contact 364. In some embodiments, redistribution layer 370 is formed by depositing a conductive material, such as Al, on the top surfaces of N-type doped semiconductor layer 304 and source contact 364 using one or more thin film deposition processes, such as ALD, CVD, PVD, any other suitable processes, or any combination thereof. As illustrated in FIG. 3M, a passivation layer 372 is formed on redistribution layer 370. In some embodiments, passivation layer 372 is formed by depositing a dielectric material, such as silicon nitride, using one or more thin film deposition processes, such as ALD, CVD, PVD, any other suitable processes, or any combination thereof. An interconnect layer 376 including ILD layers 356, redistribution layer 370, and passivation layer 372 is thereby formed, according to some embodiments.

As illustrated in FIG. 3K, contact openings 360 and 361 each extending through ILD layers 356 and N-type doped semiconductor layer 304 are formed. Contact openings 360 and 361 and source contact opening 358 can be formed using the same etching process to reduce the number of etching processes. In some embodiments, contact openings 360 and 361 are formed using wet etching and/or dry etching, such as RIE, through ILD layers 356 and N-type doped semiconductor layer 304. In some embodiments, contact openings 360 and 361 are patterned using lithography to be aligned with peripheral contacts 338 and 340, respectively. The etching of contact openings 360 and 361 can stop at the upper ends of peripheral contacts 338 and 340 to expose peripheral contacts 338 and 340. As illustrated in FIG. 3K, a spacer 362 is formed along the sidewalls of contact openings 360 and 361 to electrically isolate N-type doped semiconductor layer 304 using one or more thin film deposition processes, such as ALD, CVD, PVD, any other suitable processes, or any combination thereof.

As illustrated in FIG. 3L, contacts 366 and 368 are formed in contact openings 360 and 361, respectively (shown in FIG. 3K) at the backside of N-type doped semiconductor layer 304. Contacts 366 and 368 extend vertically through ILD layers 356 and N-type doped semiconductor layer 304, according to some embodiments. Contacts 366 and 368 and source contact 364 can be formed using the same deposition process to reduce the number of deposition processes. In some embodiments, one or more conductive materials are deposited into contact openings 360 and 361 using one or more thin film deposition processes, such as ALD, CVD, PVD, any other suitable processes, or any combination thereof, to fill contact openings 360 and 361 with an adhesive layer (e.g., TiN) and a conductor layer (e.g., W). A planarization process, such as CMP, can then be performed to remove the excess conductive materials, such that the top surfaces of contacts 366 and 368 are flush with the top surface of ILD layers 356. In some embodiments, as contact openings 360 and 361 are aligned with peripheral contacts 338 and 340, respectively, contacts 366 and 368 are above and in contact with peripheral contacts 338 and 340, respectively, as well.

As illustrated in FIG. 3M, redistribution layer 370 is also formed above and in contact with contact 366. As a result, N-type doped semiconductor layer 326 can be electrically connected to peripheral contact 338 through N-type doped semiconductor layer 304, source contact 364, redistribution layer 370 of interconnect layer 376, and contact 366. In some embodiments, N-type doped semiconductor layers 326 and 304 are electrically connected to peripheral circuits 352 through source contact 364, interconnect layer 376, contact 366, peripheral contact 338 and bonding layers 346 and 348.

As illustrated in FIG. 3M, a contact pad 374 is formed above and in contact with contact 368. In some embodiments, part of passivation layer 372 covering contact 368 is removed by wet etching and dry etching to expose part of redistribution layer 370 underneath to form contact pad 374. As a result, contact pad 374 for pad-out can be electrically connected to peripheral circuits 352 through contact 368, peripheral contact 340, and bonding layers 346 and 348.

According to one aspect of the present disclosure, a 3D memory device includes a memory stack including interleaved stack conductive layers and stack dielectric layers, a semiconductor layer, a plurality of channel structures each extending vertically through the memory stack into the semiconductor layer, and an insulating structure extending vertically through the memory stack and including a dielectric layer doped with at least one of hydrogen or an isotope of hydrogen.

In some embodiments, an atomic percent of the at least one of hydrogen or an isotope of hydrogen in the dielectric layer is not greater than about 50%. In some embodiments, the atomic percent of the at least one of hydrogen or an isotope of hydrogen in the dielectric layer is between about 1% and about 10%.

In some embodiments, the dielectric layer includes silicon nitride.

In some embodiments, the insulating structure further includes a first silicon oxide layer laterally between the dielectric layer and the stack conductive layers of the memory stack.

In some embodiments, the insulating structure further includes a second silicon oxide layer. The dielectric layer is laterally between the first and second silicon oxide layers, according to some embodiments.

In some embodiments, the insulating structure further includes a polysilicon layer. The dielectric layer is laterally between the first silicon oxide layer and the polysilicon layer, according to some embodiments.

In some embodiments, the insulating structure further includes a silicon oxide cap at one end of the insulating structure.

In some embodiments, one end of the insulating structure is flush with a respective end of the dielectric layer.

In some embodiments, the semiconductor layer includes one or more doped silicon layers.

In some embodiments, each of the channel structures includes a memory film and a semiconductor channel doped with the at least one of hydrogen or an isotope of hydrogen.

In some embodiments, the semiconductor channel includes polysilicon.

In some embodiments, the insulating structure extends laterally to separate the plurality of channel structures into a plurality of blocks.

In some embodiments, the 3D memory device further includes a source contact in contact with the semiconductor layer. The source contact and the insulating structure are on opposite sides of the semiconductor layer, according to some embodiments.

In some embodiments, the 3D memory device further includes a source contact in contact with the semiconductor layer. The source contact and the insulating structure are on a same side of the semiconductor layer, according to some embodiments.

According to another aspect of the present disclosure, a 3D memory device includes a memory stack including interleaved stack conductive layers and stack dielectric layers, a semiconductor layer, a plurality of channel structures each extending vertically through the memory stack into the semiconductor layer, and an insulating structure extending vertically through the memory stack and including a dielectric layer. Each of the channel structures includes a memory film and a semiconductor channel doped with at least one of hydrogen or an isotope of hydrogen.

In some embodiments, the dielectric layer is doped with the at least one of hydrogen or an isotope of hydrogen.

In some embodiments, an atomic percent of the at least one of hydrogen or an isotope of hydrogen in the dielectric layer is not greater than about 50%. In some embodiments, the atomic percent of the at least one of hydrogen or an isotope of hydrogen in the dielectric layer is between about 1% and about 10%.

In some embodiments, the dielectric layer includes silicon nitride.

In some embodiments, the insulating structure further includes a first silicon oxide layer laterally between the dielectric layer and the stack conductive layers of the memory stack.

In some embodiments, the insulating structure further includes a second silicon oxide layer. The dielectric layer is laterally between the first and second silicon oxide layers, according to some embodiments.

In some embodiments, the insulating structure further includes a polysilicon layer. The dielectric layer is laterally between the first silicon oxide layer and the polysilicon layer, according to some embodiments.

In some embodiments, the insulating structure further includes a silicon oxide cap at one end of the insulating structure.

In some embodiments, one end of the insulating structure is flush with a respective end of the dielectric layer.

In some embodiments, the semiconductor layer includes one or more doped silicon layers.

In some embodiments, the semiconductor channel includes polysilicon.

In some embodiments, the insulating structure extends laterally to separate the plurality of channel structures into a plurality of blocks.

In some embodiments, the 3D memory device further includes a source contact in contact with the semiconductor layer. The source contact and the insulating structure are on opposite sides of the semiconductor layer, according to some embodiments.

In some embodiments, the 3D memory device further includes a source contact in contact with the semiconductor layer. The source contact and the insulating structure are on a same side of the semiconductor layer, according to some embodiments.

According to still another aspect of the present disclosure, a method for forming a 3D memory device is disclosed. A channel structure extending vertically through a memory stack into a semiconductor layer on a substrate is formed. The memory stack includes interleaved stack conductive layers and stack dielectric layers. An insulating structure in an opening extending vertically through the memory stack and including a dielectric layer doped with at least one of hydrogen or an isotope of hydrogen is formed.

In some embodiments, at least part of the at least one of hydrogen or an isotope of hydrogen is diffused to the channel structure.

In some embodiments, to form the insulating structure, a first layer of silicon oxide, the dielectric layer, and a second layer of silicon oxide are sequentially formed in the opening.

In some embodiments, to form the insulating structure, a layer of silicon oxide, the dielectric layer, and a layer of polysilicon are sequentially formed in the opening.

In some embodiments, the insulating structure does not extend vertically into the N-type doped semiconductor layer.

In some embodiments, to form the insulating structure, a layer of silicon oxide and the dielectric layer are sequentially formed in the opening.

In some embodiments, to form the insulating structure, a silicon oxide cap is formed at an upper end of the insulating structure. In some embodiments, to form the silicon oxide cap, a top portion of at least the dielectric layer is etched back to form a recess, and a layer of silicon oxide is deposited to fill the recess.

In some embodiments, to form the dielectric layer, a layer of silicon nitride is deposited, and the layer of silicon nitride is in situ doped with the least one of hydrogen or an isotope of hydrogen.

In some embodiments, to form the dielectric layer, a layer of silicon nitride is deposited, and after the deposition, the layer of silicon nitride is annealed in the presence of the least one of hydrogen or an isotope of hydrogen.

In some embodiments, to form the channel structure, a first semiconductor layer on the substrate, a sacrificial layer on the first semiconductor layer, and a dielectric stack on the sacrificial layer are sequentially formed, the channel structure extending vertically through the dielectric stack and the sacrificial layer into the first semiconductor layer is formed, the opening extending vertically through the dielectric stack is formed, the sacrificial layer is replaced with a second semiconductor layer through the opening, and the dielectric stack is replaced with the memory stack through the opening.

In some embodiments, to form the channel structure, a channel hole extending vertically through the dielectric stack and the sacrificial layer into the first semiconductor layer is formed, and a memory film and a semiconductor channel are sequentially formed along sidewalls of the channel hole.

In some embodiments, to diffuse, the at least part of the at least one of hydrogen or an isotope of hydrogen is diffused from the dielectric layer to the semiconductor channel.

In some embodiments, the semiconductor channel comprises polysilicon.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising interleaved stack conductive layers and stack dielectric layers;
   a semiconductor layer;
   a plurality of channel structures each extending vertically through the memory stack into the semiconductor layer; and
   an insulating structure located extending vertically through the memory stack and at a distance away from adjacent channel structures, and comprising a dielectric layer doped with at least one of hydrogen or an isotope of hydrogen.

2. The 3D memory device of claim 1, wherein an atomic percent of the at least one of hydrogen or an isotope of hydrogen in the dielectric layer is not greater than about 50%.

3. The 3D memory device of claim 2, wherein the atomic percent of the at least one of hydrogen or an isotope of hydrogen in the dielectric layer is between about 1% and about 10%.

4. The 3D memory device of claim 2, wherein an atomic percent of the at least one of hydrogen or isotope of hydrogen in the semiconductor channel is less than or equal to the atomic percent of the at least one of hydrogen or isotope of hydrogen in the dielectric layer.

5. The 3D memory device of claim 1, wherein the dielectric layer comprises silicon nitride.

6. The 3D memory device of claim 1, wherein the insulating structure further comprises a first silicon oxide layer laterally between the dielectric layer and the stack conductive layers of the memory stack.

7. The 3D memory device of claim 6, wherein the insulating structure further comprises a second silicon oxide layer, wherein the dielectric layer is laterally between the first and second silicon oxide layers.

8. The 3D memory device of claim 6, wherein the insulating structure further comprises a polysilicon layer, wherein the dielectric layer is laterally between the first silicon oxide layer and the polysilicon layer.

9. The 3D memory device of claim 1, wherein the insulating structure further comprises a silicon oxide cap at one end of the insulating structure.

10. The 3D memory device of claim 1, wherein one end of the insulating structure is flush with a respective end of the dielectric layer.

11. The 3D memory device of claim 1, wherein the semiconductor layer comprises one or more doped silicon layers.

12. The 3D memory device of claim 1, wherein each of the channel structures comprises a memory film and a semiconductor channel doped with the at least one of hydrogen or an isotope of hydrogen.

13. The 3D memory device of claim 12, wherein the semiconductor channel comprises polysilicon.

14. The 3D memory device of claim 1, wherein the insulating structure extends laterally to separate the plurality of channel structures into a plurality of memory blocks.

15. The 3D memory device of claim 1, further comprising a source contact in contact with the semiconductor layer, wherein the source contact and the insulating structure are on opposite sides of the semiconductor layer.

16. The 3D memory device of claim 1, further comprising a source contact in contact with the semiconductor layer, wherein the source contact and the insulating structure are on a same side of the semiconductor layer.

17. A three-dimensional (3D) memory device, comprising:
   a memory stack comprising interleaved stack conductive layers and stack dielectric layers;
   a semiconductor layer;
   a plurality of channel structures each extending vertically through the memory stack into the semiconductor layer, wherein each of the channel structures comprises a memory film and a semiconductor channel doped with at least one of hydrogen or an isotope of hydrogen; and
   an insulating structure extending vertically through the memory stack and at a distance away from adjacent channel structures, and comprising a dielectric layer doped with the at least one of hydrogen or the isotope of hydrogen.

18. The 3D memory device of claim 17, wherein the insulating structure extends laterally to separate the plurality of channel structures into a plurality of memory blocks.

19. The 3D memory device of claim 17, wherein the dielectric layer comprises silicon nitride.

20. The 3D memory device of claim 17, wherein an atomic percent of the at least one of hydrogen or isotope of hydrogen in the semiconductor channel is less than or equal to an atomic percent of the at least one of hydrogen or isotope of hydrogen in the dielectric layer.

* * * * *